(12) United States Patent
Nojima et al.

(10) Patent No.: US 10,339,257 B2
(45) Date of Patent: Jul. 2, 2019

(54) INFORMATION PROCESSING APPARATUS, METHOD, AND STORAGE MEDIUM

(71) Applicant: CANON KABUSHIKI KAISHA, Tokyo (JP)

(72) Inventors: Toshitaka Nojima, Tokyo (JP); Toshisato Sadamatsu, Kawasaki (JP); Shinichi Hama, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 318 days.

(21) Appl. No.: 14/722,549

(22) Filed: May 27, 2015

(65) Prior Publication Data
US 2015/0347668 A1 Dec. 3, 2015

(30) Foreign Application Priority Data
May 30, 2014 (JP) .................................. 2014-112746

(51) Int. Cl.
*G06F 17/50* (2006.01)
(52) U.S. Cl.
CPC ................................ *G06F 17/5081* (2013.01)
(58) Field of Classification Search
USPC ........................................................ 716/115
See application file for complete search history.

(56) References Cited

U.S. PATENT DOCUMENTS

| | | | | |
|---|---|---|---|---|
| 6,405,357 B1* | 6/2002 | Chao | ................... | G06F 17/5068 257/676 |
| 7,464,348 B1* | 12/2008 | Lockman | ............ | G06F 17/5077 716/104 |
| 2006/0161874 A1* | 7/2006 | Harada | ............... | G06F 17/5068 716/112 |

FOREIGN PATENT DOCUMENTS

| | | |
|---|---|---|
| JP | 2000105777 A | 4/2000 |
| JP | 2002016337 A | 1/2002 |
| JP | 2010211751 A | 9/2010 |

OTHER PUBLICATIONS

Office Action issued in Japanese Appln. No. 2014-112746 dated Apr. 10, 2018. English Translation provided.

\* cited by examiner

*Primary Examiner* — Eric D Lee
(74) *Attorney, Agent, or Firm* — Rossi, Kimms & McDowell LLP

(57) ABSTRACT

In a layout design of a printed circuit board, more accurate bypass capacitor arrangement that has taken into consideration a wiring within a package of an IC is implemented. An information processing apparatus according to the present invention includes: a die pad specifying unit configured to specify a power source pad of a die and a ground pad of the die from design information on a printed circuit board; a bypass capacitor specifying unit configured to specify a bypass capacitor that is arranged on the printed circuit board from the design information; and a unit configured to derive an evaluation value for evaluating the arrangement of the specified bypass capacitor based on the design information, information on the specified power source pad of the die and ground pad of the die, and information on the specified bypass capacitor.

18 Claims, 19 Drawing Sheets

| REFERENCE DESIGNATOR | PIN NAME | SIGNAL NAME | PRIORITY | IN-PACKAGE PATH LENGTH |
|---|---|---|---|---|
| IC1 | P1101a | +1.2V | 1 | 1.2mm |
| IC1 | P1101d | +1.2V | 4 | 3.4mm |
| IC1 | P1101b | +1.2V | 2 | 1.5mm |
| IC1 | P1101c | +1.2V | 3 | 2.8mm |

| REFERENCE DESIGNATOR | PIN NAME | SIGNAL NAME | BYPASS CAPACITOR | PRIORITY | REMARKS |
|---|---|---|---|---|---|
| IC1 | P1101a | +1.2V | C401a | 1 | |
| IC1 | P1101d | +1.2V | C401b | 4 | CONNECT TO THE PIN 1101B |
| IC1 | P1101b | +1.2V | UNCONNECTED | 2 | |
| IC1 | P1101c | +1.2V | UNCONNECTED | 3 | |

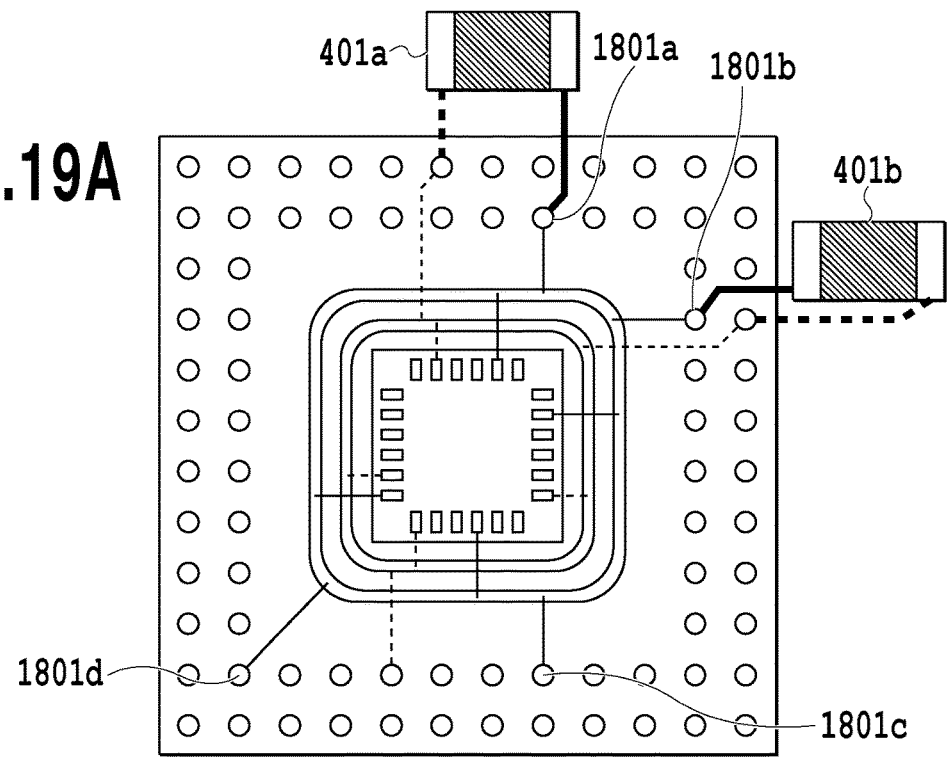
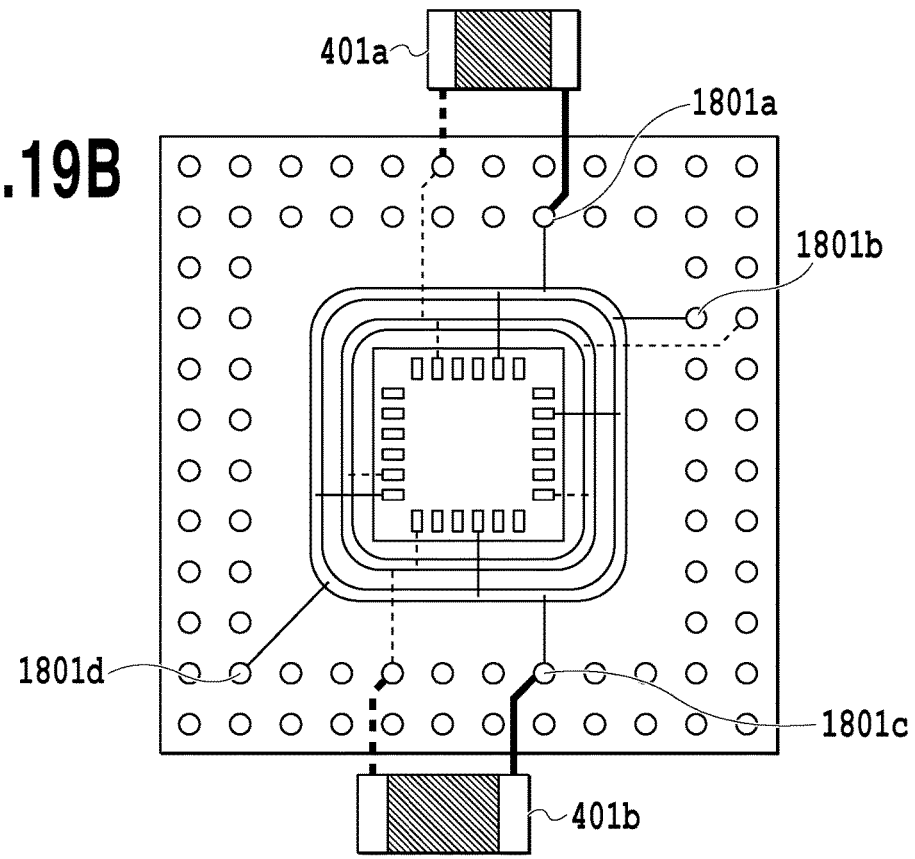

INFORMATION PROCESSING APPARATUS, METHOD, AND STORAGE MEDIUM

BACKGROUND OF THE INVENTION

Field of the Invention

The present invention relates to a technique to verify bypass capacitor arrangement in order to suppress noise, which occurs from power source pins of the IC, within a printed circuit board by taking into account the IC package.

Description of the Related Art

As the signal speed becomes higher in an integrated circuit (IC) or in a large-scale integration (LSI), simultaneous switching noise becomes larger. In the case where the simultaneous switching noise becomes large, the power source voltage fluctuates, and therefore, a malfunction or poor signal transmission occurs in the IC or LSI, and in the case where the simultaneous switching noise is caused to propagate to the outside of the board, the radiation noise characteristics become worse. In order to avoid these problems, a bypass capacitor is arranged in the vicinity of the power source pin of the IC.

As a technique to appropriately arrange a bypass capacitor, in Japanese Patent Laid-Open No. 2002-16337, a technique has been disclosed that displays measures and instructions in the case where the length of the wiring that connects the power source pin of the IC and the power source pin of the bypass capacitor is equal to or greater than a predetermined length based on the design information on the printed circuit board.

However, with the technique disclosed in Japanese Patent Laid-Open No. 2002-16337, it is not possible to verify the bypass capacity arrangement with high accuracy because the in-package wiring of the IC is not taken into account.

SUMMARY OF THE INVENTION

Because of this, an object of the present invention is to make it possible to grasp appropriate bypass capacitor arrangement in a printed circuit board with high accuracy.

The information processing apparatus according to the present invention is an information processing apparatus including: a die pad specifying unit configured to specify a power source pad of a die and a ground pad of the die from design information on a printed circuit board; a bypass capacitor specifying unit configured to specify a bypass capacitor arranged on the printed circuit board from the design information; and a unit configured to derive an evaluation value for evaluating the arrangement of the specified bypass capacitor based on the design information, information on the specified power source pad of the die and ground pad of the die, and information on the specified bypass capacitor.

Further features of the present invention will become apparent from the following description of exemplary embodiments (with reference to the attached drawings).

BRIEF DESCRIPTION OF THE DRAWINGS

FIG. 18 is a diagram explaining an example of a method of determining whether a plurality of package VTs at the same potential is located with a predetermined distance being kept in between; and FIGS. 19A and 19B are diagrams explaining the way a bypass capacitor is rearranged.

DESCRIPTION OF THE EMBODIMENTS

Hereinafter, with reference to the attached drawings, the present invention is explained in detail based on preferred embodiments. Configurations shown in the following embodiments are just exemplary and the present invention is not limited to the configurations shown schematically.

First Embodiment

Figure 1:
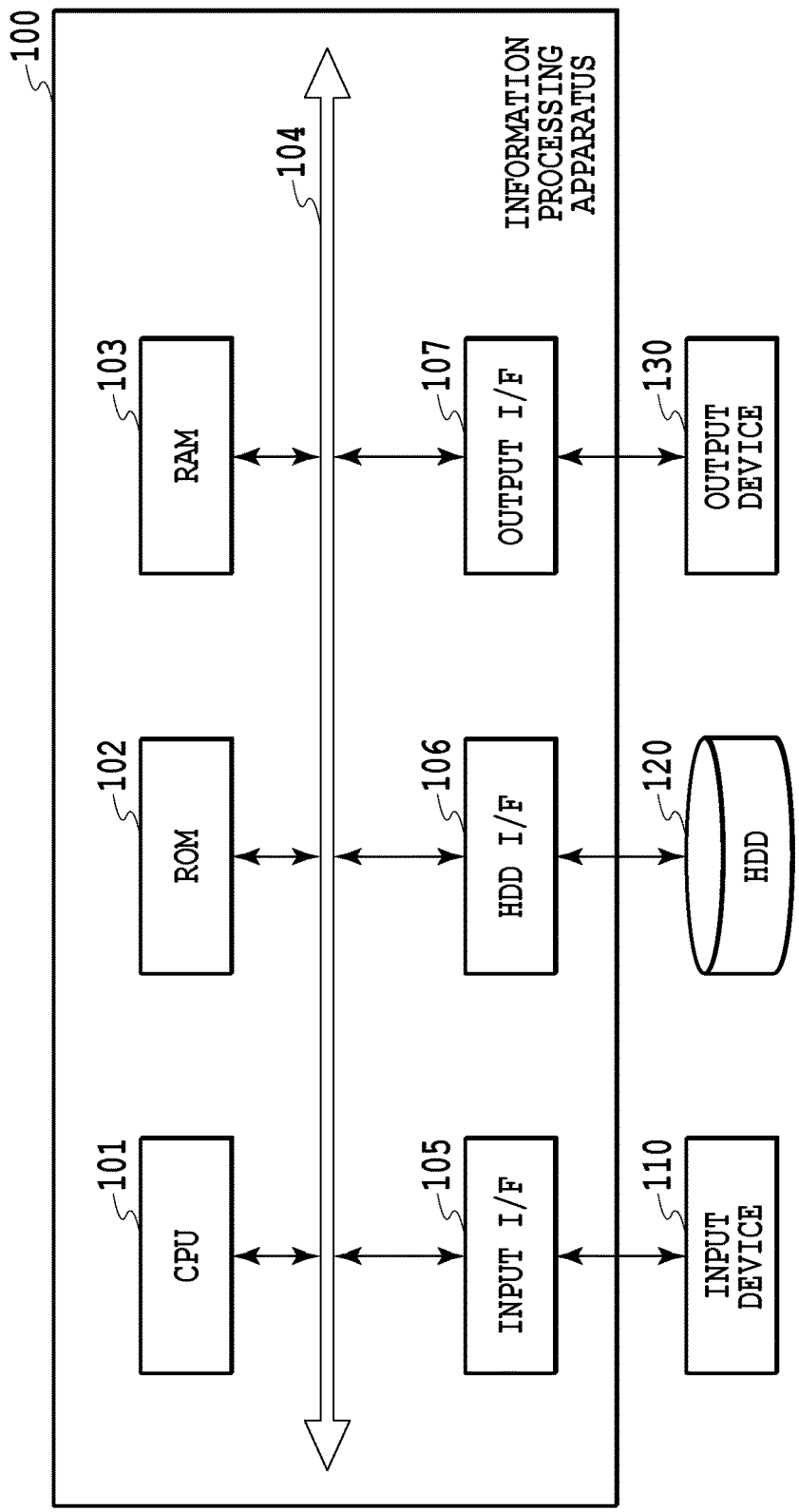
FIG. 1 is a diagram showing an outline configuration of an information processing apparatus, such as a PC, as an apparatus for verifying bypass capacitor arrangement.

FIG. 1 is a diagram showing an outline configuration of an information processing apparatus, such as a PC, as an apparatus for verifying bypass capacitor arrangement according to the present embodiment. An information processing apparatus 100 includes a CPU 101, a ROM 102, a RAM 103, a system bus 104, an input I/F 105, an HDD I/F 106, and an output I/F 107.

The CPU 101 executes programs stored in the ROM 102 and a hard disk drive (HDD) 120 by using the RAM 103 as a work memory and controls each unit, to be described later, via the system bus 104. The input interface (I/F) 105 is a serial bus interface, such as, for example, USB and IEEE1394, for connecting an input device 110, such as a keyboard and a mouse. It is possible for the CPU 101 to read various kinds of data from the input device 110 via the input I/F 105. The HDD interface (I/F) 106 is an interface, such as, for example, serial ATA (SATA), for connecting an external storage device, such as the HDD 120 and an optical disc drive. It is possible for the CPU 101 to read data from the HDD 120 and write data to the HDD 120 via the HDD I/F 106. Further, it is possible for the CPU 101 to develop data stored in the HDD 120 onto the RAM 103 and to save the data developed onto the RAM 103 in the HDD 120. Then, it is possible for the CPU 101 to execute the data developed onto the RAM 103 by regarding the data as a program. The output interface (I/F) 107 is a serial bus interface, such as, for example, USB and IEEE1394, for connecting an output device 130, such as a display unit such as a liquid crystal monitor, and a printer. The CPU 101 causes a display unit such as a liquid crystal monitor to produce a display of various kinds of information via the output interface 107 or causes a printer to print calculation results or the like output onto the display unit.

Within the HDD 120, programs for embodying the present invention and various kinds of data, such as information on design (hereinafter, design information) of the layout of the printed circuit board are stored. The design information includes parts information, wiring information, drill information, layer information, package information, etc. The contents of each piece of information are as follows.

Figure 2:
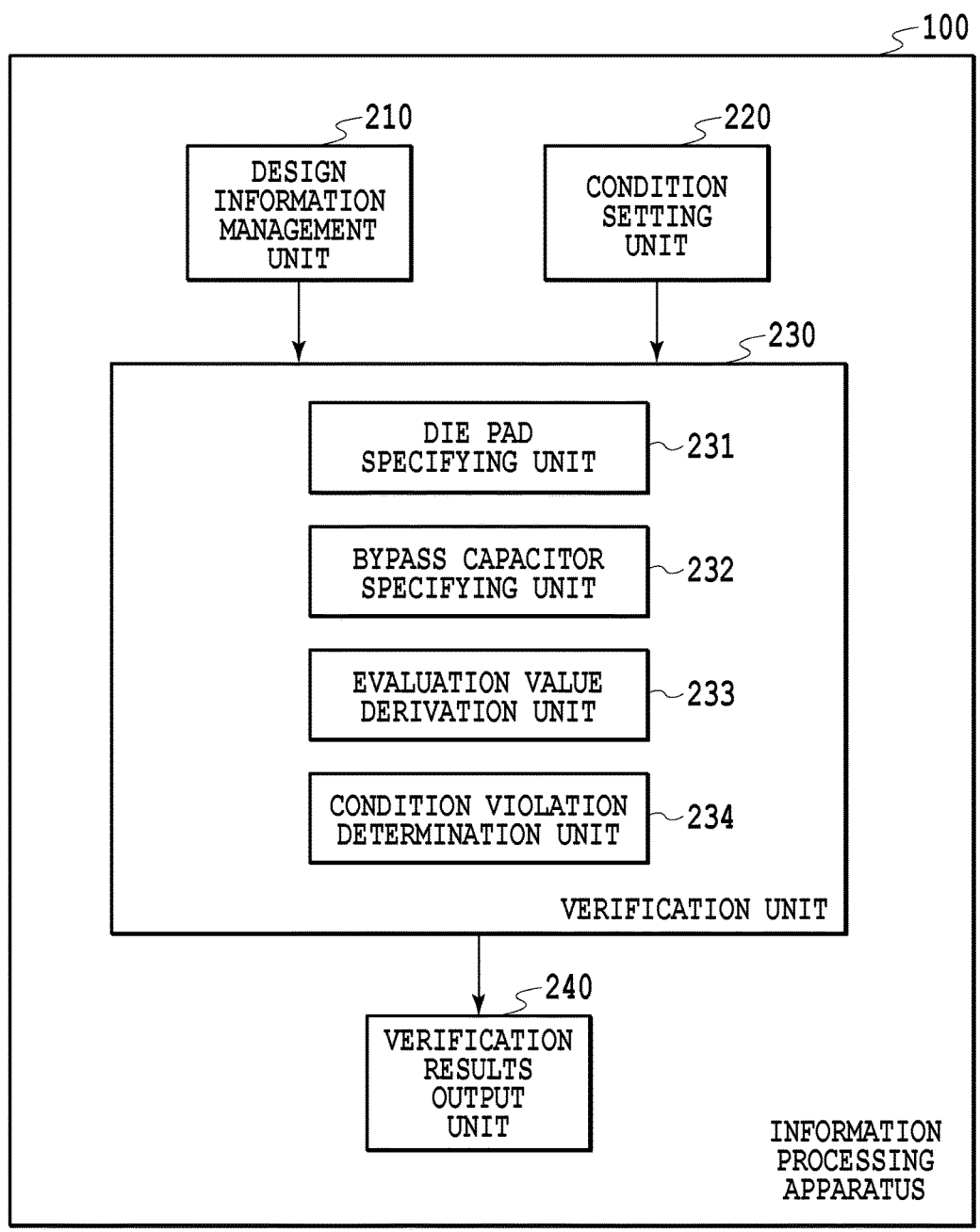
FIG. 2 is a function block diagram showing a software configuration of an information processing apparatus as an apparatus for verifying bypass capacitor arrangement according to a first embodiment.

<Parts Information>
  Information about the reference designators, position coordinates, and shapes of the parts on the printed circuit board
  Information on the shapes of electrically conductive portions to which pins of the parts are connected, and signal names
<Wiring Information>
  Information on the names of signals that flow through wirings between parts
  Information on the position coordinates of each point constituting wiring figures
  Information on the net lists representing the logical connection relationship on the circuit, which are specified by using the reference designators, pin numbers, and signal names
<Drill Information>
  Information on the position coordinates, shapes, etc., of drilled holes
<Layer Information>
  Information about the layer configurations of the printed circuit board
<Package Information>
  Information on the position coordinates of die pads and package pins
  Information on the names of signals that flow through wiring between die pads and package pins
  Information on the position coordinates of each point constituting wiring figures
  Information on the net lists representing the logical connection relationship between the die pads and package pins FIG. 2 is a function block diagram showing a software configuration of the information processing apparatus 100 as an apparatus for verifying bypass capacitor arrangement according to the present embodiment. The information processing apparatus 100 according to the present embodiment includes a design information management unit 210, a condition setting unit 220, a verification unit 230, and a verification results output unit 240.

The design information management unit 210 manages design information input by a user using the input device 110. The design information management unit 210 sends the design information to the verification unit 230 upon receipt of instructions to perform verification from a user.

The condition setting unit 220 sets a verification condition at the time of performing bypass capacitor arrangement verification processing in accordance with a user's input via the input device 110. The set verification condition is sent to the verification unit 230.

The verification unit 230 performs processing to verify whether the bypass capacitor arrangement is appropriate in accordance with the verification condition set by the condition setting unit 220 by using the design information received from the design information management unit 210. The verification unit 230 in the present embodiment includes a die pad specifying unit 231, a bypass capacitor specifying unit 232, an evaluation value derivation unit 233, and a condition violation determination unit 234.

The die pad specifying unit 231 specifies the pads of the power source of the die (hereinafter also referred to as die power source pad) and the pads of the ground of the die (hereinafter also referred to as die ground pad) based on the input design information. Information on the specified die power source pad and die ground pad is stored in the RAM 103. It may also be possible to specify the pads based on information on the die power source pad and the die ground pad input directly by a user using the input device 110.

The bypass capacitor specifying unit 232 specifies the bypass capacitor on the printed circuit board based on the input design information and the information on the die power source pad and the die ground pad specified by the die pad specifying unit 231. The information on the specified bypass capacitor is stored in the RAM 103.

The evaluation value derivation unit 233 derives an evaluation value for evaluating the bypass capacitor arrangement based on the input design information, the information on the specified die power source pad and die ground pad, and the information on the specified bypass capacitor. In the present embodiment, the length of a path from the die power source pad up to the die ground pad via the bypass capacitor is derived as an evaluation value.

The condition violation determination unit 234 determines whether the evaluation value derived by the evaluation value derivation unit 233 meets the verification condition. The results of the determination (results of the verification) are stored in the RAM 103.

The verification results output unit 240 reports the results of the verification to the user by displaying a warning on the display unit based on the results of the verification, producing a printout of the results of the verification by using a printer, or transmitting the data of the results of the verification via a network I/F, not shown.

Figure 3:
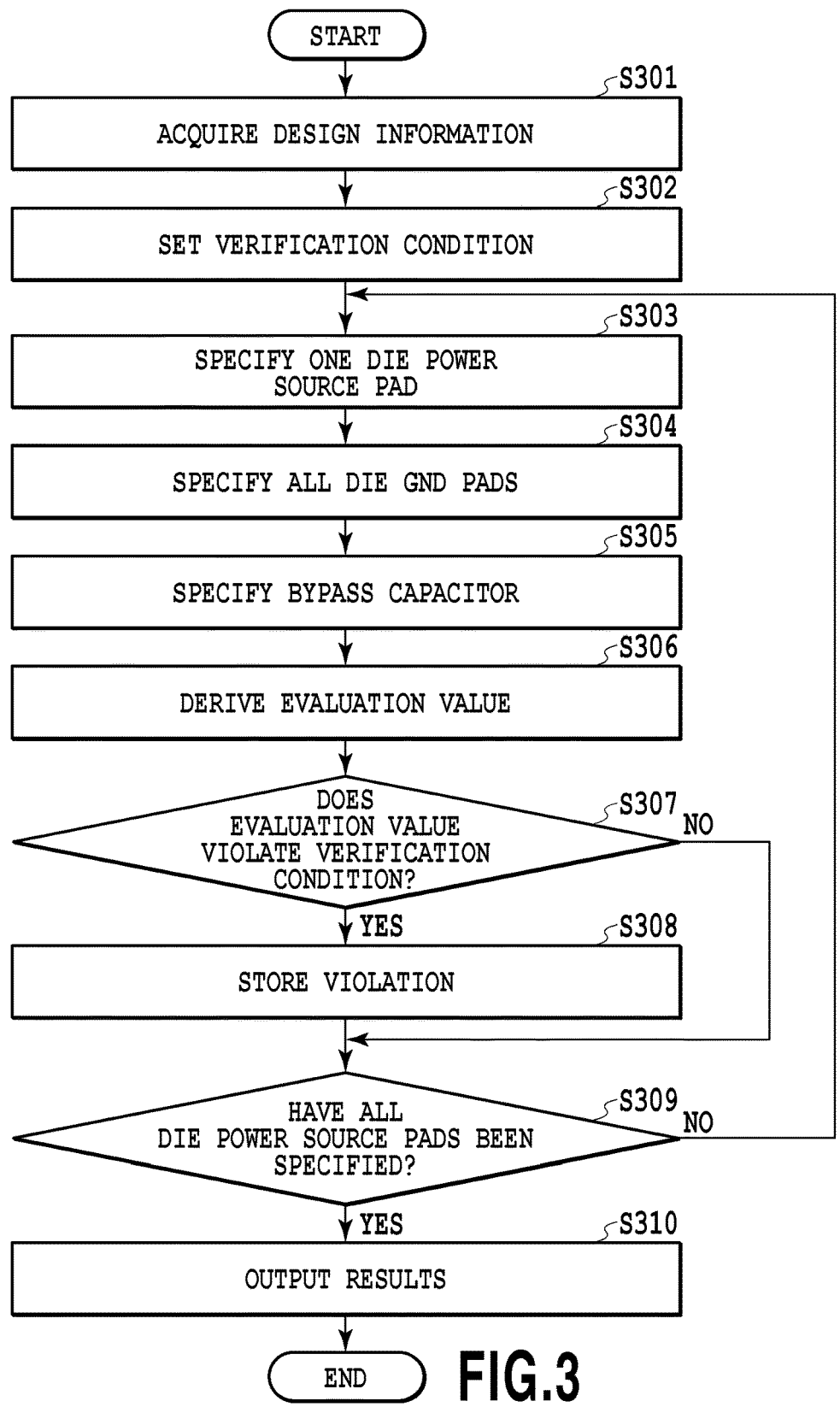
FIG. 3 is a flowchart showing a flow of bypass capacitor arrangement verification processing according to the first embodiment.
Figure 4A:
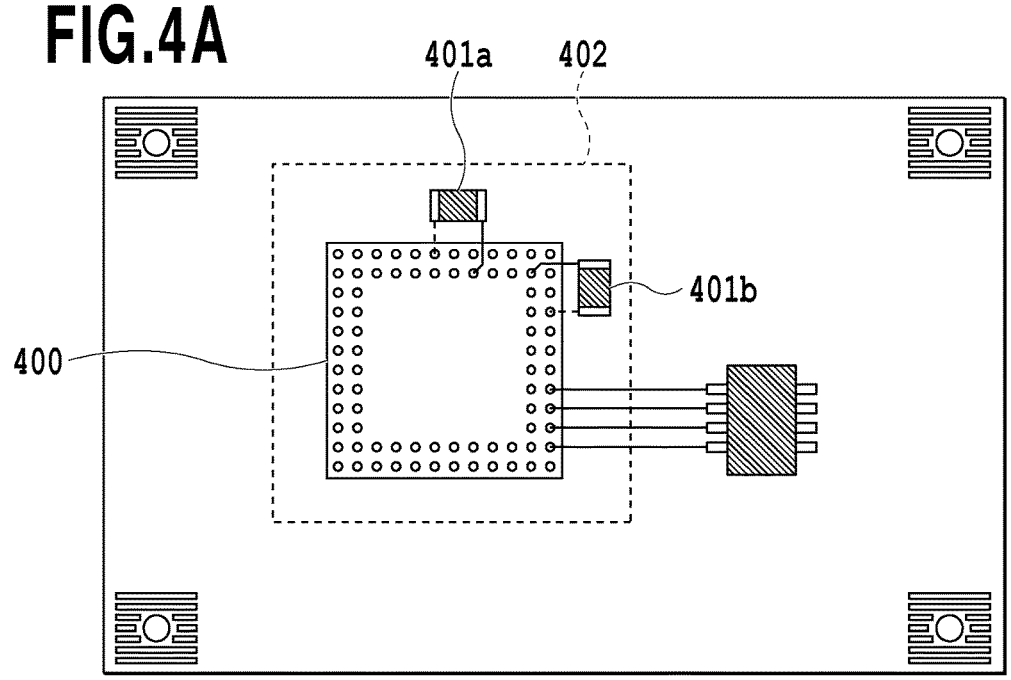
FIGS. 4A and 4B are schematic diagrams showing a layout of a printed circuit board in the layout design completion stage.
Figure 4B:
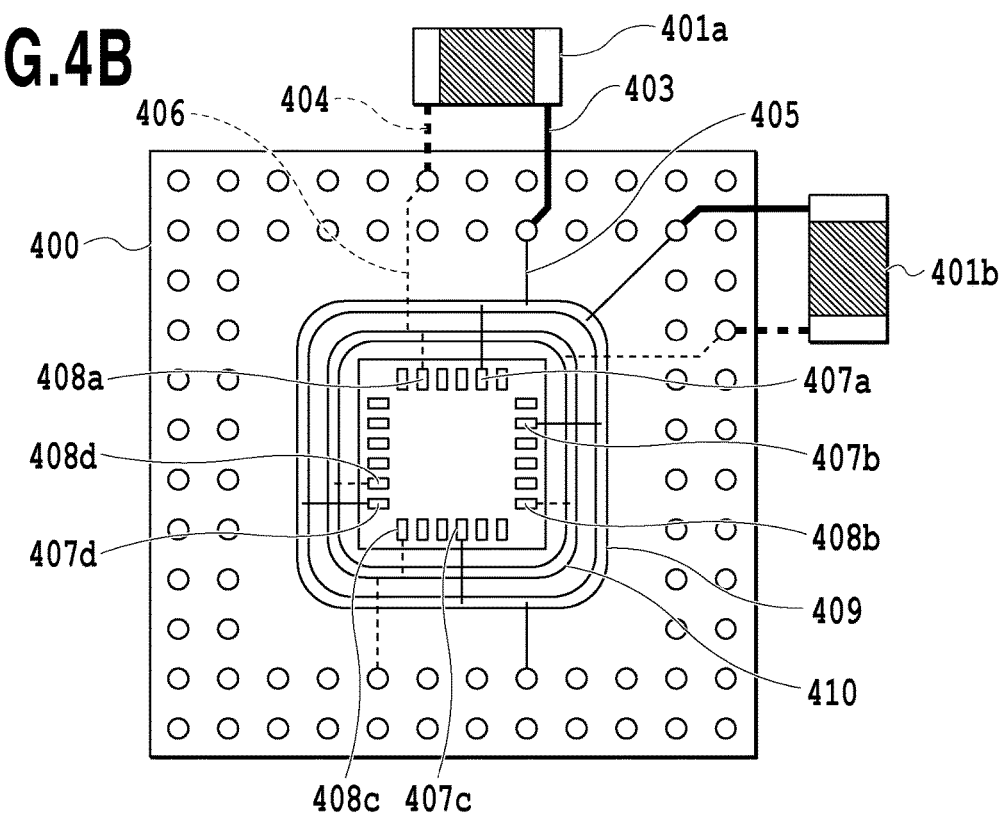

FIG. 3 is a flowchart showing a flow of bypass capacitor arrangement verification processing according to the present embodiment. The series of processing is implemented by the CPU 101 loading programs stored in the ROM 102 onto the RAM 103 and executing the programs. In the following explanation, FIGS. 4A and 4B showing an outline of the printed circuit board and the IC package are referred to appropriately. In the case of an actual printed circuit board and an IC package, wiring is routed densely in a complicated manner, but the explanation of the outline given below is not intended to exclude the case.

Before explaining the flow in FIG. 3, the printed circuit board and the IC package shown in FIGS. 4A and 4B are explained. FIG. 4A is a schematic diagram showing a layout of the printed circuit board including an IC 400 to which bypass capacitors 401a and 401b are connected in the layout design completion stage. FIG. 4B is an enlarged view of an area 402 indicated by the broken line in FIG. 4A. In FIG. 4B, reference numeral 403 denotes a power source wiring on the printed circuit board and 404 denotes a ground wiring on the printed circuit board. Reference numeral 405 denotes the power source wiring within the package and 406 denotes the ground wiring within the package. Reference numerals 407a to 407d denote power source pads of the die and 408a to 408d denote ground pads of the die. Reference numeral 409 denotes a power source ring within the package and 410 denotes a ground ring within the package.

Subsequently, the flowchart in FIG. 3 is explained in detail.

At step 301, the design information management unit 210 sends the design information in the layout design completion stage, which is the target of verification processing, to the verification unit 230.

At step 302, the verification condition setting unit 220 sets a verification condition in accordance with the contents that are input via the input device 110. Here, the verification condition is a condition based on which whether the arrangement of the bypass capacitor specified by the above-described design information is appropriate is determined. In the present embodiment, the condition refers to a threshold value (hereinafter, a permitted value) indicating a path length that is permitted in the case where the length of the path from the die power source pad up to the die ground pad via the bypass capacitor is taken to be an evaluation value.

At step 303, the die pad specifying unit 231 within the verification unit 230 specifies one of the die power source pads (hereinafter, die VT) by using the acquired design information. In the first routine, the die VT 407a is specified by, for example, the information indicative of the die pad and the signal name indicating the power source included in the package information within the design information. Then, in the second and subsequent routines, the other die VTs 407b to 407d are specified sequentially (see FIG. 4). Information on the specified die VT is stored in the RAM 103.

At step 304, the die pad specifying unit 231 within the verification unit 230 specifies all the die ground pads (hereinafter, die GT) by using the acquired design information. For example, the die GTs 408a to 408d are specified by the information indicative of the die pad and the signal name indicating the ground included in the package information within the design information (see FIG. 4). Information on all the specified die GTs is stored in the RAM 103.

At step 305, the bypass capacitor specifying unit 232 within the verification unit 230 specifies the capacitors on the printed circuit board, which are connected to the die VTs specified at step 303 and to the die GTs specified at step 304, as the bypass capacitors. In the example in FIG. 4, the capacitors 401a and 401b that are connected to the power source wiring 403 at the same potential as that of the die VT 407a and to the ground wiring 404 at the same potential as that of the die GTs 408a to 408d are specified as the bypass capacitors. Information on the specified capacitors (bypass capacitors) is stored in the RAM 103.

At step 306, the evaluation value derivation unit 233 within the verification unit 230 derives the length of the path from the die VT specified at step 303 up to each die GT specified at step 304 via the bypass capacitor specified at step 305 as the evaluation value. In the case where a plurality of specified bypass capacitors exists, the evaluation value derivation processing is performed for each bypass capacitor. For example, in the case of the bypass capacitor 401a in FIG. 4, a shortest path search is carried out by using a planar figure in which the die VT 407a is taken to be the start point and the power source side pin of the bypass capacitor 401a is taken to be the endpoint. Further, a shortest path search is carried out by taking the ground side pin of the bypass capacitor 401a to be the start point and each of the die GTs 408a to 408d to be the endpoint. Then, the length (hereinafter, loop length) that is the sum of the lengths of the paths obtained by the above-described two kinds of shortest path searches is found. For the bypass capacitor 401a, loop distances in the following four patterns are found as a result.

1) "the die VT 407a to the power source side pin of the bypass capacitor 401a"+"the ground side pin of the bypass capacitor 401a to the die GT 408a"

2) "the die VT 407a to the power source side pin of the bypass capacitor 401a"+"the ground side pin of the bypass capacitor 401a to the die GT 408b"

3) "the die VT 407a to the power source side pin of the bypass capacitor 401a"+"the ground side pin of the bypass capacitor 401a to the die GT 408c"

4) "the die VT 407a to the power source side pin of the bypass capacitor 401a"+"the ground side pin of the bypass capacitor 401a to the die GT 408d"

The derived loop distances are stored in the RAM 103 as the evaluation values.

At step 307, the condition violation determination unit 234 within the verification unit 230 compares the derived evaluation values (loop distances) and the verification condition set at step 302 (loop distance as the permitted value) and determines whether the evaluation value agrees with the verification condition for each bypass capacitor. In this case, the determination is performed for the bypass capacitor whose evaluation value is the highest (here, the bypass capacitor whose loop distance is the shortest) among all the evaluation values derived for each bypass capacitor. In the case where the derived evaluation value (loop distance) is greater than the loop distance (e.g., 13 mm) set as the permitted value, it is determined that the verification condition is violated, and the processing proceeds to step 308. On the other hand, in the case where the derived evaluation value (loop distance) is equal to or less than the loop distance set as the permitted value, it is determined that the verification condition is met, and the processing proceeds to step 309.

At step 308, the condition violation determination unit 234 within the verification unit 230 stores information indicative of that the verification condition is violated (hereinafter, violation information) in the RAM 103. The violation information includes, for example, the reference designator and the pin name of the IC, the reference designator and the coordinates of the bypass capacitor, the signal name of the power source wiring and the ground wiring, etc.

At step 309, the verification unit 230 determines whether all the die VTs have been specified. In the case where there is a die VT that has not been specified yet, the processing returns to step 303, and the next one die VT is specified and the processing at each of steps 304 to 308 is repeated. On the other hand, in the case where all the die VTs have been specified, the processing proceeds to step 310.

Figures 5A, 5B:
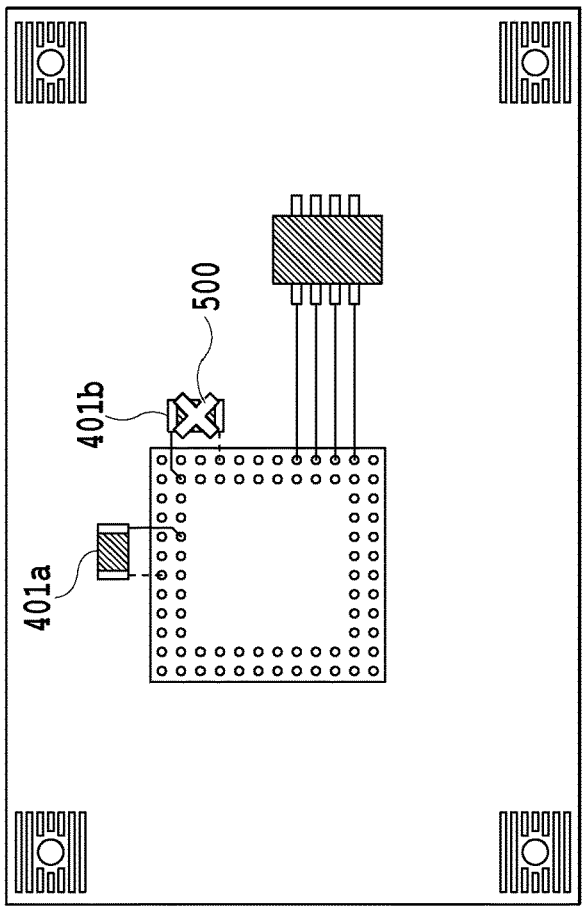
FIGS. 5A and 5B are diagrams showing examples of a verification results output in the first embodiment.

At step 310, the verification results output unit 240 outputs the verification results to the output device 130. Specifically, the verification results output unit 240 displays the verification results on the display unit or prints the verification results by using a printer. Alternatively, it may also be possible for the verification results output unit 240 to store a file in which the verification results are described in the HDD 120 or to transmit the file to another PC or the like via a network, not shown. FIGS. 5A and 5B are diagrams showing examples of the output of the verification results in the present embodiment. FIG. 5A is an example visually indicating the results in the case where it is determined that the evaluation value of the bypass capacitor 401b, among the bypass capacitors 401a and 401b, does not meet the verification condition. Here, while the set verification condition (permitted value) is 13 mm, the derived loop distance is, for example, 15 mm, and therefore, a symbol 500 of a x mark indicating the violation is shown on the layout screen. FIG. 5B is an example showing the same verification results in the form of a table including the following items.

Reference designator, pin name, signal name of IC

Reference designator, coordinates, mount surface of bypass capacitor

Derived evaluation value (loop distance) and determination results therefor

In the case of FIG. 5B, for example, it may also be possible to design the screen so that a bypass capacitor, which is selected by a user selecting the reference designator or the like of the bypass capacitor in the table displayed on the display unit by using the input device 110, is highlighted on a highlight, zoom, or popup screen on the layout screen. In the case where the verification results are output in the form of a table, it may also be possible to use the pin names on the package side corresponding to the pad names of the die VT and the die GT specified at steps 303 and 304 described above in place of the pad names of the die VT and the die GT, or to indicate both the pad names.

The above is the contents of the processing to verify the bypass capacitor arrangement according to the present embodiment.

Figure 6:
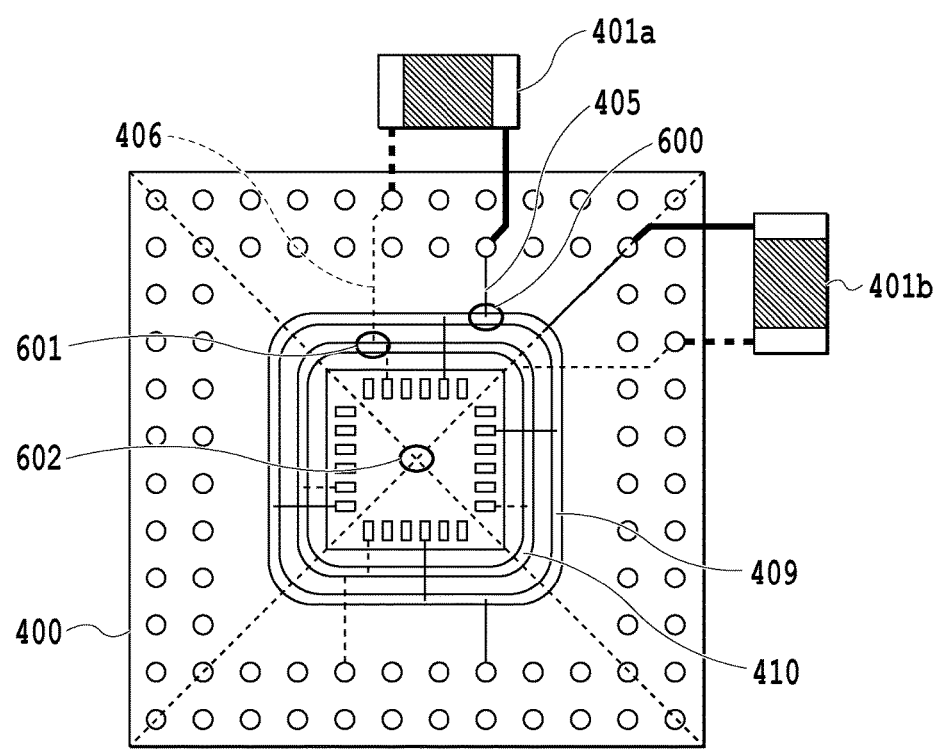
FIG. 6 is a diagram explaining a method of specifying a virtual die VT and a virtual die GT.

At steps 303 and 304 described above, the actual positions of the die VT and the die GT are specified from the acquired design information, but it may also be possible to specify virtual positions of the die VT and the die GT based on the design information. FIG. 6 is a diagram explaining a method of specifying the virtual die VT and die GT. In FIG. 6, for example, it can be thought to specify a connection point 600 at which the power source wiring 405 of the package and the power source ring 409 are connected with each other as the virtual die VT. Further, it may also be possible to specify center coordinates 602 of the IC 400 as the virtual die VT. For the virtual die GT, as in the case where the virtual die VT is specified, it may also be possible to specify a connection point 601 at which the power source wiring 406 of the package and the ground ring 410 are connected with each other, or the center coordinates 602 of the IC 400 as the virtual die GT. By virtually specifying the power source pad and the ground pad as described above, it is possible to simplify the whole of the processing.

Further, in the present embodiment, the loop distances as the evaluation values are derived by the processing performed once. However, there can be thought a case where the design information on the package and the design information on the printed circuit board do not exist in the same CAD. In the case such as this, it is sufficient to derive the loop distance as the evaluation value by separately calculating the paths.

Furthermore, it may also be possible to find an inductance in place of the loop distance and to take the inductance to be the evaluation value. In this case, as the verification condition, a value indicating a predetermined inductance is set as a permitted value.

In the present embodiment, the loop distance is calculated as the evaluation value, but there can be thought a case where the path does not exist. In the case such as this, it is sufficient to report the fact to a user by displaying information on the violation that the path cannot be calculated as the verification results.

As above, according to the present embodiment, it is possible to verify whether the bypass capacitor arrangement is appropriate by taking into consideration the wiring within the IC package. As a result of this, it is made possible to determine the bypass capacitor arrangement with accuracy.

Second Embodiment

The first embodiment is the aspect in which the bypass capacitor arrangement is verified by taking into consideration the wiring within the IC package after the layout design is completed. Next, an aspect in which the bypass capacitor arrangement is verified in the layout design stage is explained as a second embodiment. Explanation of the portions in common to those of the first embodiment is omitted or simplified and in the following, different points are explained mainly.

Figure 7:
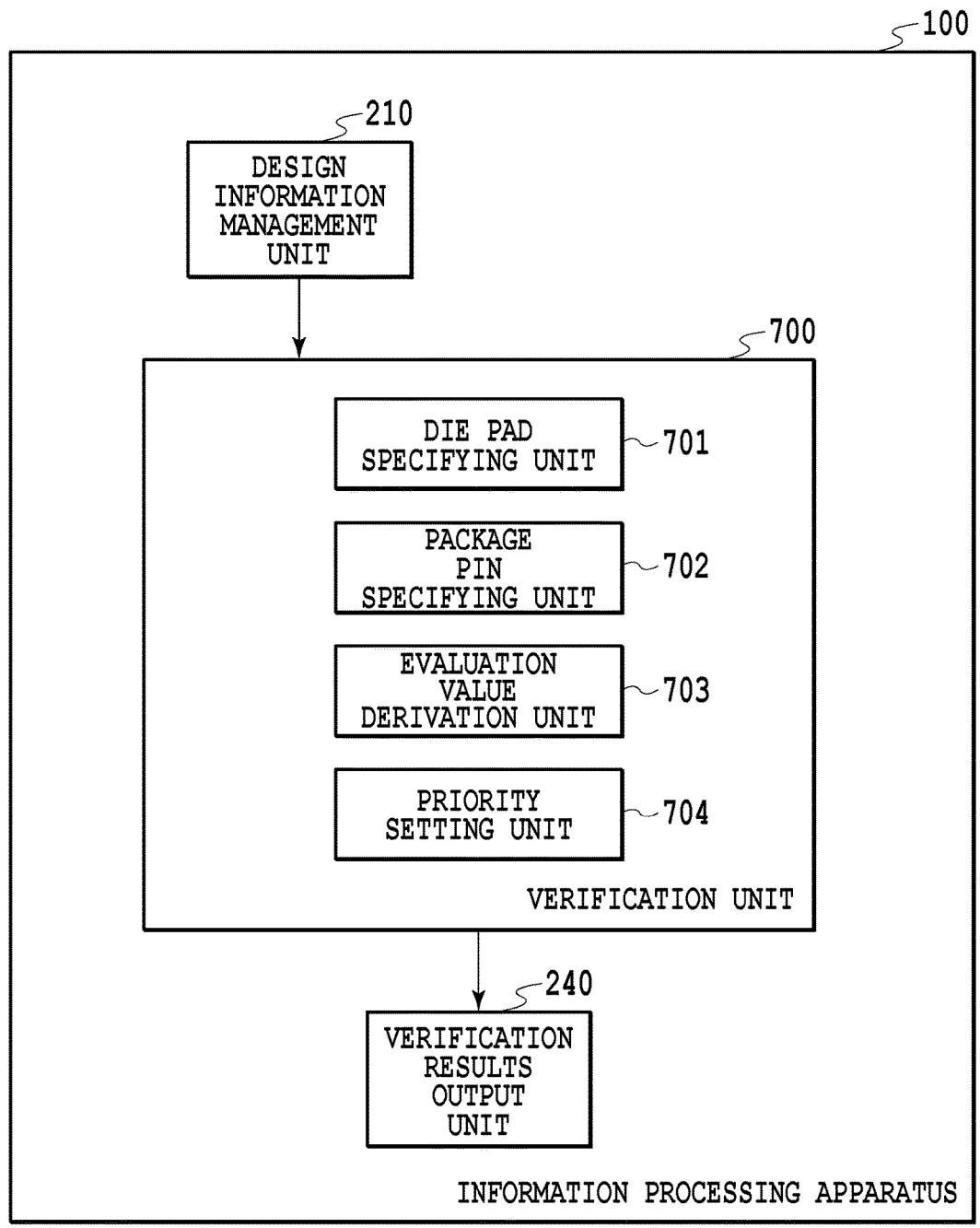
FIG. 7 is a function block diagram showing a software configuration of an information processing apparatus as an apparatus for verifying bypass capacitor arrangement according to a second embodiment.

FIG. 7 is a function block diagram showing a software configuration of the information processing apparatus 100 as an apparatus for verifying the bypass capacitor arrangement according to the present embodiment. The information processing apparatus 100 according to the present embodiment includes the design information management unit 210, a verification unit 700, and the verification results output unit 240.

The design information management unit 210 and the verification results output unit 240 are the same as those of the first embodiment. Hereinafter, the verification unit 700, which is the feature of the present embodiment, is explained.

The verification unit 700 includes a die pad specifying unit 701, a package pin specifying unit 702, an evaluation value derivation unit 703, and a priority setting unit 704.

The die pad specifying unit 701 specifies the power source pad of the die (die VT) based on the input design information. Information on the specified die VT is stored in the RAM 103.

The package pin specifying unit 702 specifies the power source pin of the package (hereinafter, package VT) based on the input design information. Information on the specified package VT is stored in the RAM 103. It may also be possible to specify based on information for specifying the power source pin of the package, which is input by a user using the input device 110.

The evaluation value derivation unit 703 derives an evaluation value for evaluating the bypass capacitor arrangement based on the input design information, the information on the specified die VT, and the information on the specified package VT. In the present embodiment, the path length (length of the path from the die VT up to the package VT) within the package is derived as the evaluation value.

Figure 8A:
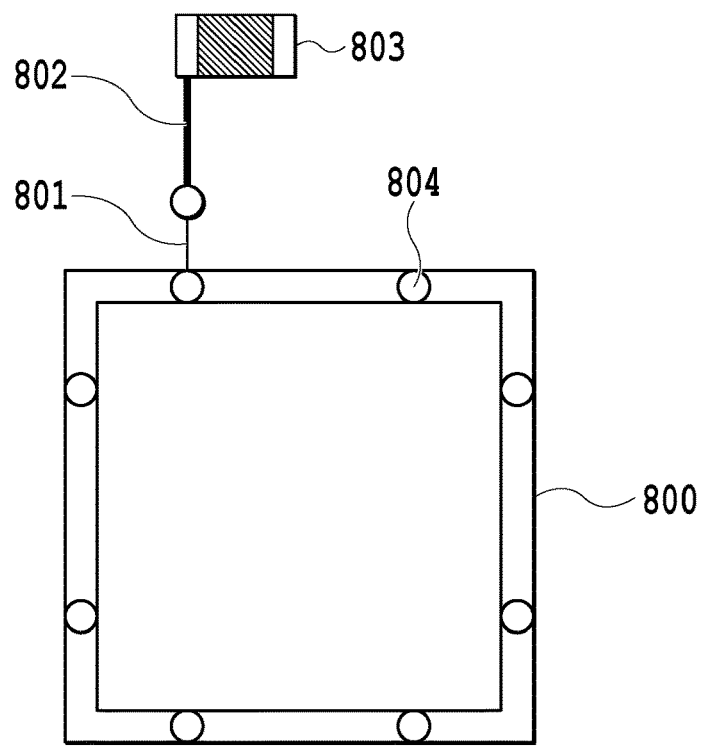
FIGS. 8A and 8B are diagrams showing simulation models.
Figure 8B:
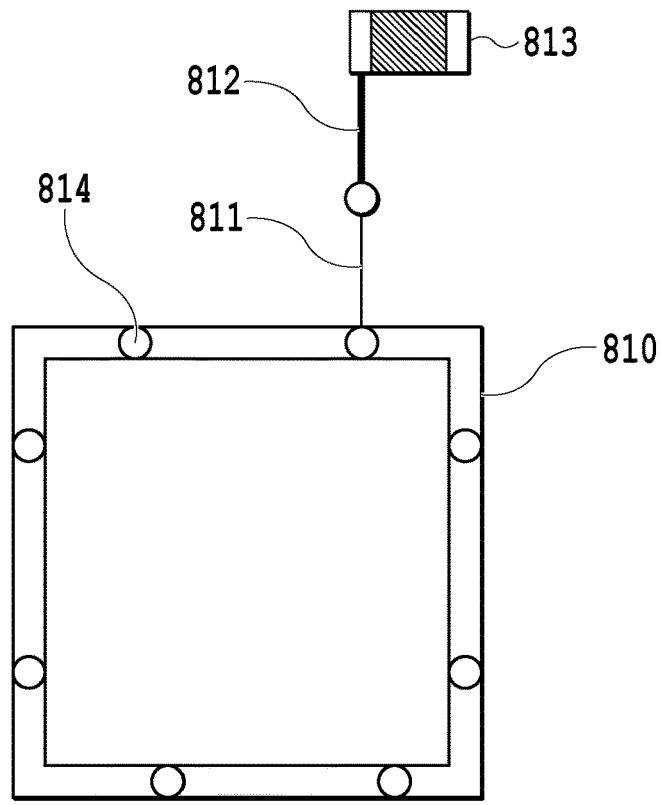
Figure 9A:
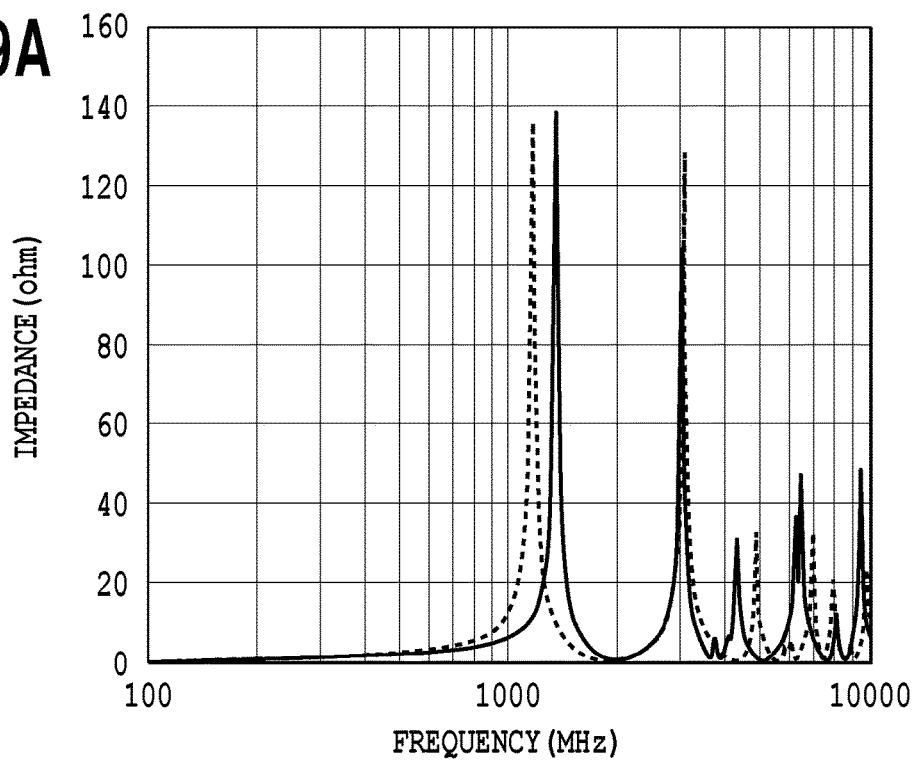
FIGS. 9A and 9B are graphs representing the results of measuring impedances in the simulation models.
Figure 9B:
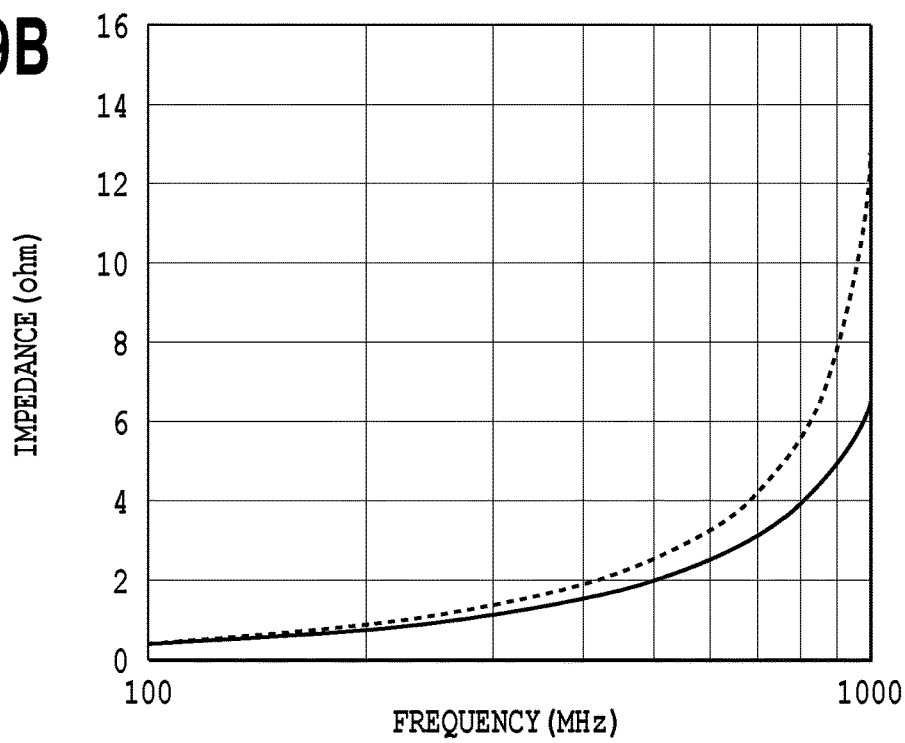

The priority setting unit 704 sets a priority to the specified package VT based on the evaluation value derived by the evaluation value derivation unit 703. Here, the priority indicates a desirable order in which a bypass capacitor is connected to one of the package VTs at the same potential, and the shorter the path within the package, the higher the priority is set. The reason a higher priority is set to the package VT whose path within the package is shorter is explained by using simulation results. FIGS. 8A and 8B are diagrams showing simulation models and FIG. 8A shows a model whose path within the package is short and FIG. 8B shows a model whose path within the package is long. The model in FIG. 8A includes a power source ring 800, an in-package wiring 801 that is connected to the power source ring 800, a wiring 802 on the printed circuit board, and a bypass capacitor 803. Similarly, the model in FIG. 8B includes a power source ring 810, an in-package wiring 811 that is connected to the power source ring 810, a wiring 812 on the printed circuit board, and a bypass capacitor 813. Then, the length of the in-package wiring 801 in FIG. 8A is shorter than that of the in-package wiring 811 in FIG. 8B. In these two models, impedances at measurement points indicted by points 804 and 814 are measured, respectively. FIG. 9A is a graph representing the results of measuring impedances in both the models and the solid line corresponds to the model whose path within the package is short and the broken line corresponds to the model whose path within the package is long. FIG. 9B is an enlarged view of the portion in which the frequency is equal to or lower than 1 GHz (1,000 MHz). By focusing attention on frequencies equal to or lower than 1 GHz (1,000 MHz), it is known that the impedance of the model whose path length within the package is short is lower (FIG. 9B). It is known that a reduction in impedance of the path from the power source ring up to the bypass capacity is important in order to stably supply a power source to the IC. Because of this, a higher priority is set to the package VT whose path within the package is shorter so that the bypass capacitor is connected to the package VT whose impedance of the patch from the power source ring up to the bypass capacitor is lower. The set priority is stored in the RAM 103 as the verification results.

The verification results output unit 240 reports the priorities set by the priority setting unit 704 to a user as the verification results by displaying the priorities on the display unit, by producing a printout of the priorities by using a printer, by transmitting the data of the verification results via a network I/F, not shown, etc.

Figure 10:
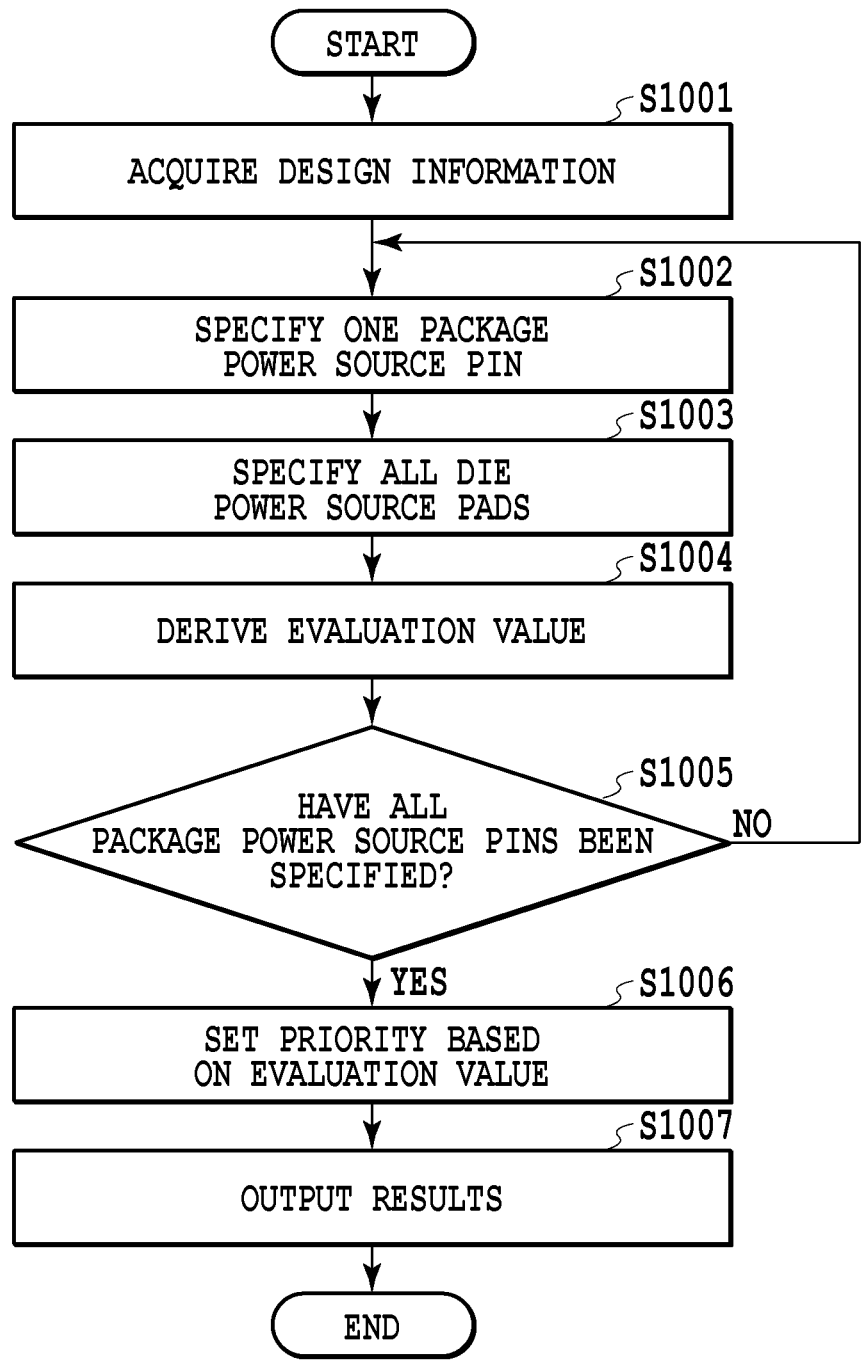
FIG. 10 is a flowchart showing a flow of bypass capacitor arrangement verification processing according to the second embodiment.

FIG. 10 is a flowchart showing a flow of bypass capacitor arrangement verification processing according to the present embodiment. The series of processing is implemented by the CPU 101 loading programs stored in the ROM 102 onto the RAM 103 and executing the programs.

At step 1001, the design information management unit 210 sends the design information in the layout design stage, which is the target of the verification processing, to the verification unit 700.

Figure 11:
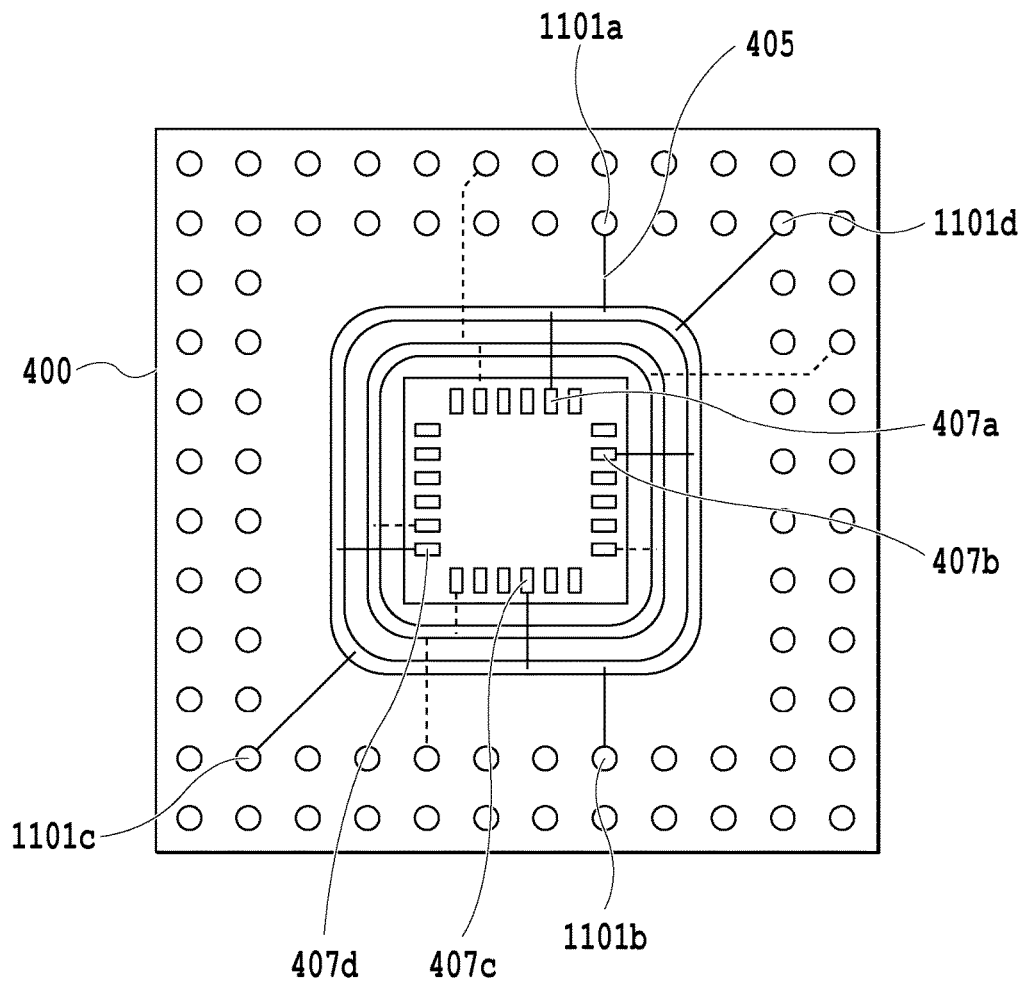
FIG. 11 is a schematic diagram showing an IC layout in the layout design stage.

At step 1002, the package pin specifying unit 702 within the verification unit 700 specifies one package VT by using the acquired design information. FIG. 11 is a schematic diagram showing the layout of the IC 400 in the layout design stage. In this case, in the first routine, for example, a package VT 1101a that is connected to the in-package power source wiring 405 is specified. Then, in the second and subsequent routines, other package VTs 1101b to 1101d are specified sequentially. Alternatively, it may also be possible to specify the package VT of the IC, which is connected to the power source wiring on the printed circuit, board based on the information about the layout of the printed circuit board within the design information. Information on the specified package VTs is stored in the RAM 103.

At step 1003, the die pad specifying unit 701 within the verification unit 700 specifies all the die VTs by using the acquired design information. For example, by the information indicative of the die pad and the signal name indicating the power source, which are included in the IC package information within the design information, the die VTs 407a to 407d are specified (see FIG. 11). Information on the specified die VTs is stored in the RAM 103.

At step 1004, the evaluation value derivation unit 703 within the verification unit 700 derives the length of the path from the package VT specified at step 1002 up to each die VT specified at step 1003. The derived path lengths are stored in the RAM 103 as the evaluation values.

At step 1005, the verification unit 700 determines whether there is a package VT that has not been specified yet. In the case where there is a package VT that has not been specified yet, the processing returns to step 1002, and the next package VT is specified and the processing at steps 1003 to 1005 is repeated. On the other hand, in the case where all the package VTs have been specified, the processing proceeds to step 1006.

At step 1006, the priority setting unit 704 within the verification unit 700 sets priorities in the case where the bypass capacitor is connected to all the specified package VTs. Specifically, first, the package VTs connected to the power source wiring whose signal name (signal name that identifies the kind of the power source of the printed circuit board) is the same are grouped. In the example in FIG. 11, the four package VTs 1101a to 1101d are grouped. Then, priorities are set to the package VTs in the group in the order from the package VT whose in-package path length derived at step 1001 is the shortest. In the case of FIG. 11, the order from the shortest path length that is derived is as follows.

Path from the package VT 1101a up to the die VT 407a
Path from the package VT 1101b up to the die VT 407c
Path from the package VT 1101c up to the die VT 407d
Path from the package VT 1101d up to the die VT 407b Consequently, the priority of the package VT 1101a is the highest and that of the package VT 1101d is the lowest, i.e., the order is 1101a, 1101b, 110c, and 1101d from the highest priority. Information on the priorities determined in this manner is stored in the RAM 103.

Figures 12A, 12B:
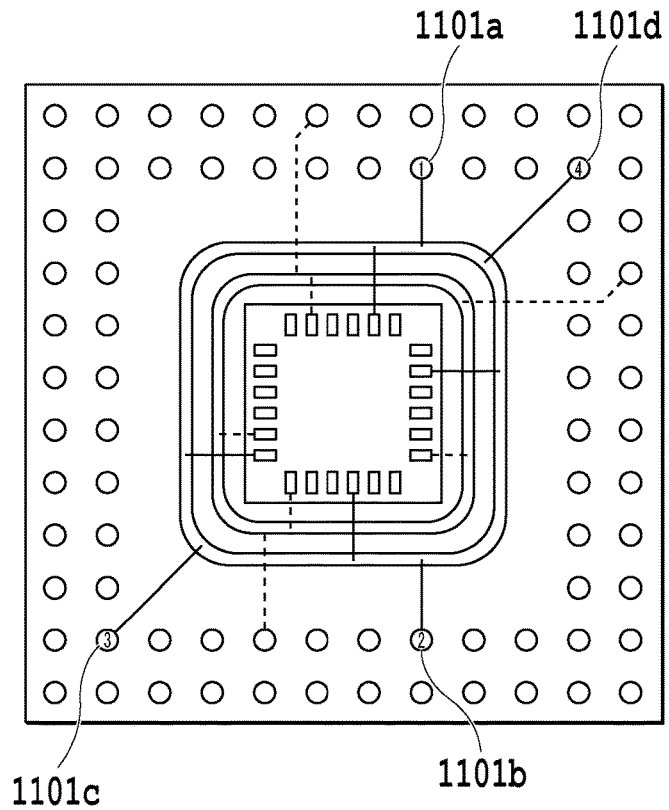
FIGS. 12A and 12B are diagrams showing examples of a verification results output in the second embodiment.

At step 1007, the verification results output unit 240 outputs the priorities as the verification results to the output device 130. Specifically, the verification results output unit 240 displays the verification results on the display unit, prints the verification results by using a printer, etc. Alternatively, it may also be possible to store a file in which the verification results are described in the HDD 120 or to transmit the file to another PC or the like via a network, not shown. FIGS. 12A and 12B are diagrams showing examples of the output of the verification results in the present embodiment. FIG. 12A is an example in the case where the priorities set to the package VTs 1101a to 1101d are shown visually, in which the priorities are indicated by numerals on the layout screen. It may also be possible to produce a display in which the package VTs 1101a to 1101d are highlighted in the order of the priorities by using a combination of colors or the like. FIG. 12B shows an example in which, along with the reference designator, the pin names, and the signal name of the IC, the corresponding priorities are shown in the form of a table. In this case, for example, it may also be possible to design the screen so that a bypass capacitor, which is selected by a user selecting the reference designator or the like of the bypass capacitor in the table displayed on the display unit by using the input device 110, is highlighted on a highlight, zoom, or popup screen on the layout screen.

The above is the contents of the processing to verify the bypass capacitor arrangement according to the present embodiment.

As another method of determining priorities, it may also be possible to derive the path lengths up to all the die VTs that can be connected and totalize the path lengths, and to set the priorities in the order from the package VT whose totalization results (total path length) are the shortest.

In the present embodiment, the length of the shortest path is taken to be the evaluation value, but is may also be possible to find an inductance in place of the length of the shortest path and to take the inductance to be the evaluation value. In this case, it is sufficient to set priorities so that a higher priority is set to a path whose inductance is lower.

<Modification Example of Second Embodiment>

Figures 13A, 13B:
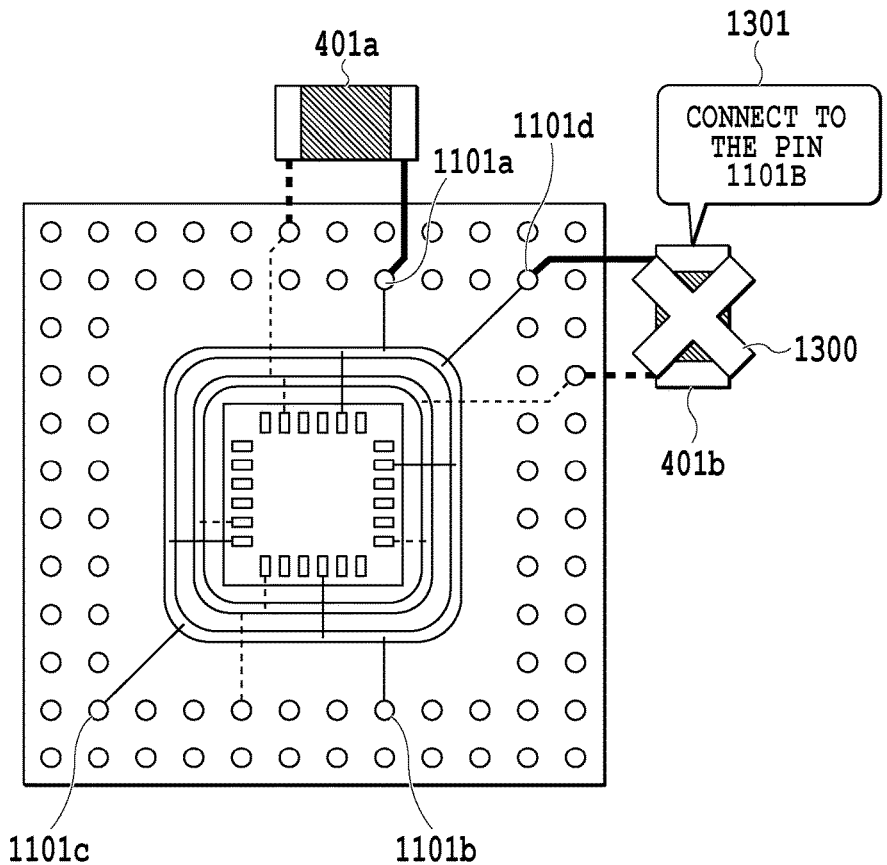
FIGS. 13A and 13B are diagrams showing examples of the verification results output according to a modification example of the second embodiment.

In the layout completion stage (state where bypass capacitors have already been arranged), it may also be possible to determine the validity of the arrangement by using the priorities set as described above and to output the determination results. Specifically, after the priorities are set at step 1006, a bypass capacitor is specified based on the design information, and whether the priority of the package VT to which the specified bypass capacitor is connected is high is determined and the specified bypass capacitor is output along with the determination results as the verification results. FIGS. 13A and 13B are diagrams showing examples of the output of the verification results according to the modification example. In FIG. 13A, the bypass capacitor 401*b* is connected to the package VT 1101*d* whose priority is the lowest. FIG. 13A shows the way a message 1301 to prompt the connection to another power source pin (package VT 1101*b*) whose priority is higher is displayed on the layout screen, in addition to a x mark 1300 indicating that the arrangement of the bypass capacitor 401*b* is inappropriate. In FIG. 13B, which shows an example of the output in the form of a table, a comment having the same contents as those of the above-described message 1301 is displayed in the remark box, in addition to the reference designator, the pin names, and the signal name of the IC, the reference designators of the bypass capacitors, and the set priorities.

Further, in the parts arrangement stage of the layout design, it may also be possible to automatically arrange a bypass capacitor by using the priorities set as described above. Specifically, after the priorities are set at step 1006, a bypass capacitor is specified based on the design information and the bypass capacitor is arranged in the vicinity of the package VT, having a high priority, to which the specified bypass capacitor is connected.

According to the present embodiment, it is possible to easily grasp a power source pin of the package suitable to the arrangement of a bypass capacitor in the layout design stage (or after the layout is completed), and therefore, it is made possible to efficiently arrange a bypass capacitor.

Third Embodiment

Next, an aspect that enables sparse arrangement in which a plurality of bypass capacitors is not arranged densely is explained as a third embodiment. Explanation of the portions in common to those of the first and second embodiments is omitted or simplified and in the following, different points are explained mainly.

Figure 14:
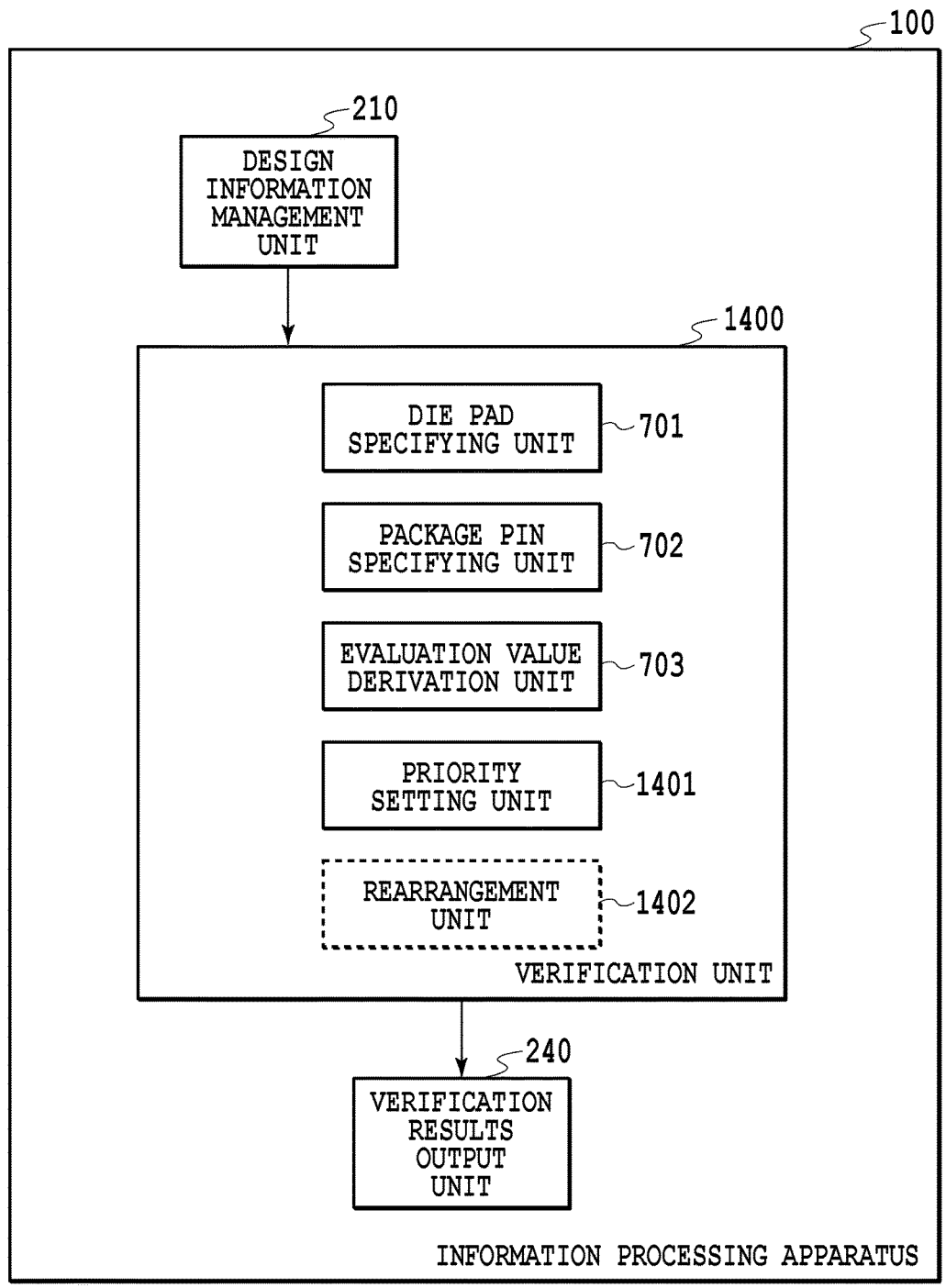
FIG. 14 is a function block diagram showing a software configuration of an information processing apparatus as an apparatus for verifying bypass capacitor arrangement according to a third embodiment.

FIG. 14 is a function block diagram showing a software configuration of the information processing apparatus 100 as an apparatus for verifying bypass capacitor arrangement according to the present embodiment. The information processing apparatus 100 according to the present embodiment includes the design information management unit 210, a verification unit 1400, and the verification results output unit 240.

The design information management unit 210 and the verification results output unit 240 are the same as those of the first and second embodiments, and therefore, explanation is omitted.

The verification unit 1400 includes the die pad specifying unit 701, the package pin specifying unit 702, the evaluation value derivation unit 703, a priority setting unit 1401, and a rearrangement unit 1402. The reason the rearrangement unit 1402 is indicated by a broken line is that the rearrangement unit 1402 functions only in the case where the input design information is information in the layout completion stage of the layout design.

The die pad specifying unit 701, the package pin specifying unit 702, and the evaluation value derivation unit 703 are the same as those of the second embodiment.

Figure 15A:
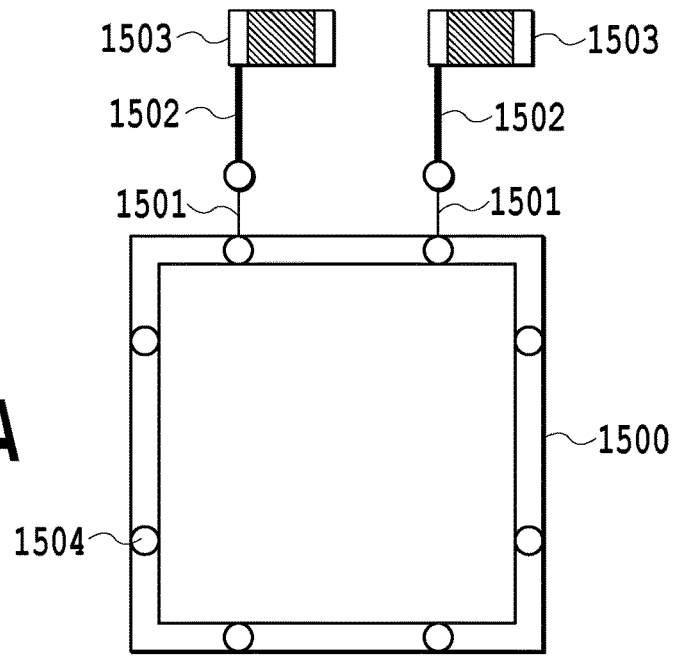
FIGS. 15A and 15B are diagrams showing simulation models.
Figure 15B:
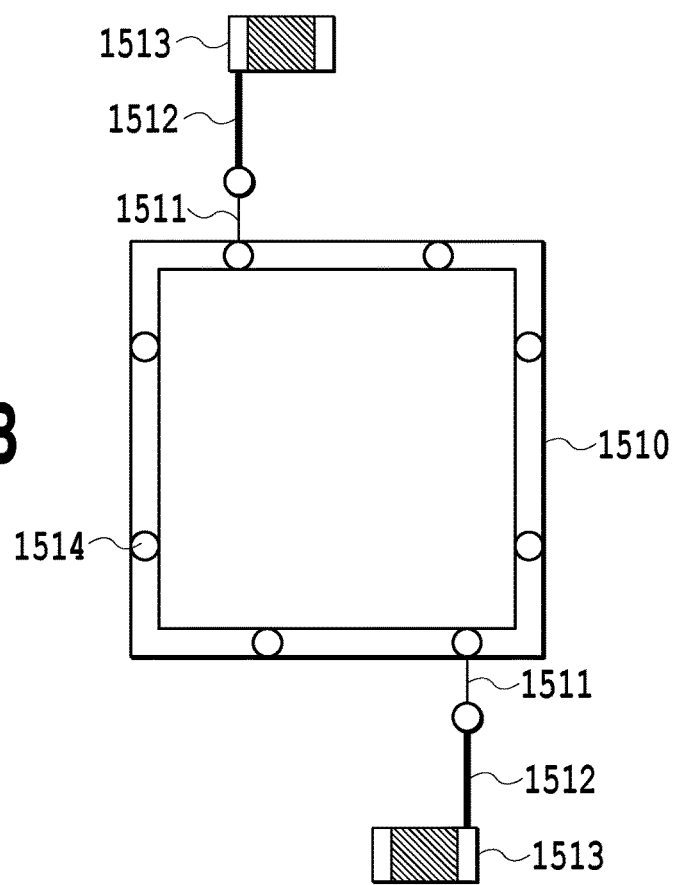
Figure 16A:
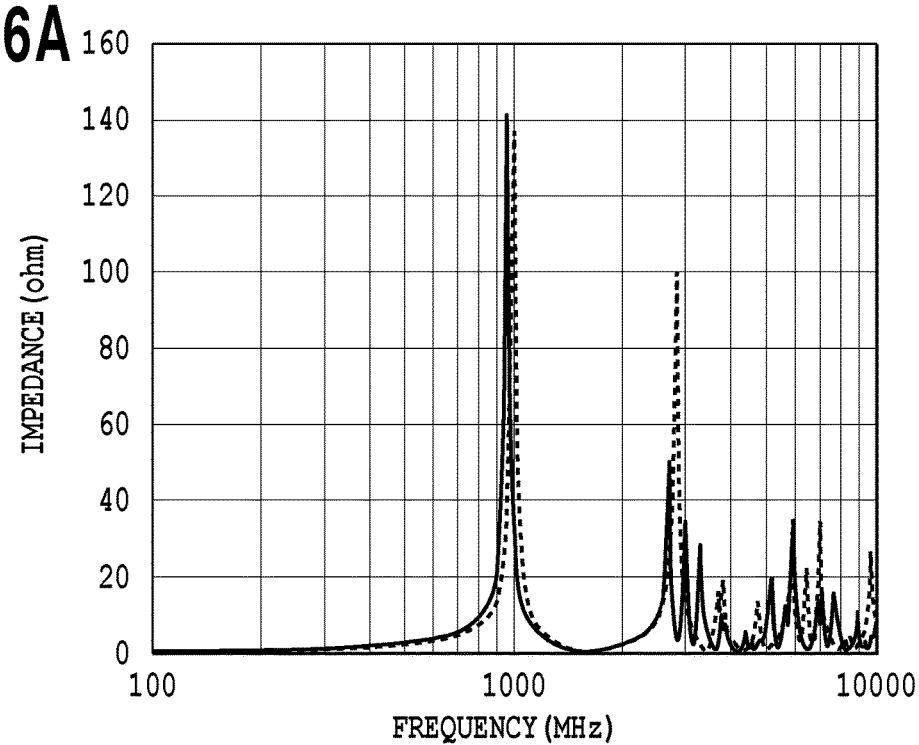
FIGS. 16A and 16B are graphs representing the results of measuring impedances in the simulation model.
Figure 16B:
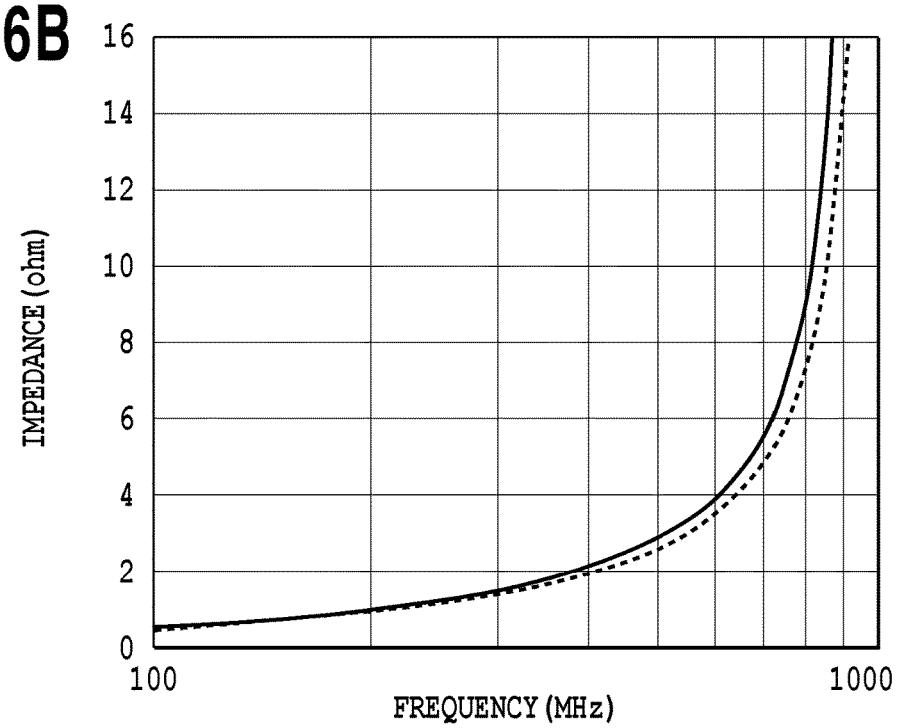

The priority setting unit 1401 sets priorities to the package VTs based on the evaluation values derived by the evaluation value derivation unit 703 as in the case of the priority setting unit 704 according to the second embodiment. In addition to the above, the priority setting unit 1401 according to the present embodiment also performs processing to change the priorities so as to eliminate the dense state in the case where the package VTs to which high priorities are set are located densely within a predetermined range. Here, the reason the priorities of the package VTs are changed so as to eliminate the dense state is explained by using simulation results. FIGS. 15A and 15B are diagrams showing simulation models, and FIG. 15A shows a model in which bypass capacitors are located densely and FIG. 15B shows a model in which bypass capacitors are located sparsely. The model in FIG. 15A includes a power source ring 1500, an in-package wiring 1501 connected to the power source ring 1500, a wiring 1502 on the printed circuit board, and two bypass capacitors 1503 arranged close to each other. Similarly, the model in FIG. 15B includes a power source ring 1510, an in-package wiring 1511 connected to the power source ring 1510, a wiring 1512 on the printed circuit board, and two bypass capacitors 1513 arranged with a predetermined distance being kept in between. It is assumed that the conditions, such as the length of the in-package wiring and the length of the wiring on the printed circuit board, are the same in FIG. 15A and FIG. 15B and only the position relationship between the two bypass capacitors is different. In these two models, impedances at measurement points indicated by points 1504 and 1514 are measured, respectively. FIG. 16A is a graph representing the measurement results of the impedances in both the models and the solid line corresponds to the mode in which the bypass capacitors are located densely and the broken line corresponds to the model in which the bypass capacitors are located sparsely. Then, FIG. 16B is an enlarged view of the portion of frequencies equal to or lower than 1 GHz (1,000 MHz). By focusing attention on the frequencies equal to or lower than 1 GHz (1,000 MHz), it is known that the impedance is lower in the model in which the bypass capacitors are located sparsely (FIG. 16B). As described previously, in order to stably supply a power source to the IC, it is preferable for the impedance of the path from the power source ring up to the bypass capacitor to be low, and therefore, the priorities are changed so that the bypass capacitors are arranged as sparsely as possible with respect to the power source ring. The set (changed) priorities are stored in the RAM 103 as the verification results.

The rearrangement unit 1402 rearranges the bypass capacitors so that the package VTs are located sparsely in accordance with the changed priorities in the case where the package VTs specified by the package pin specifying unit 702 are too close to each other in the layout design completion stage.

Figure 17:
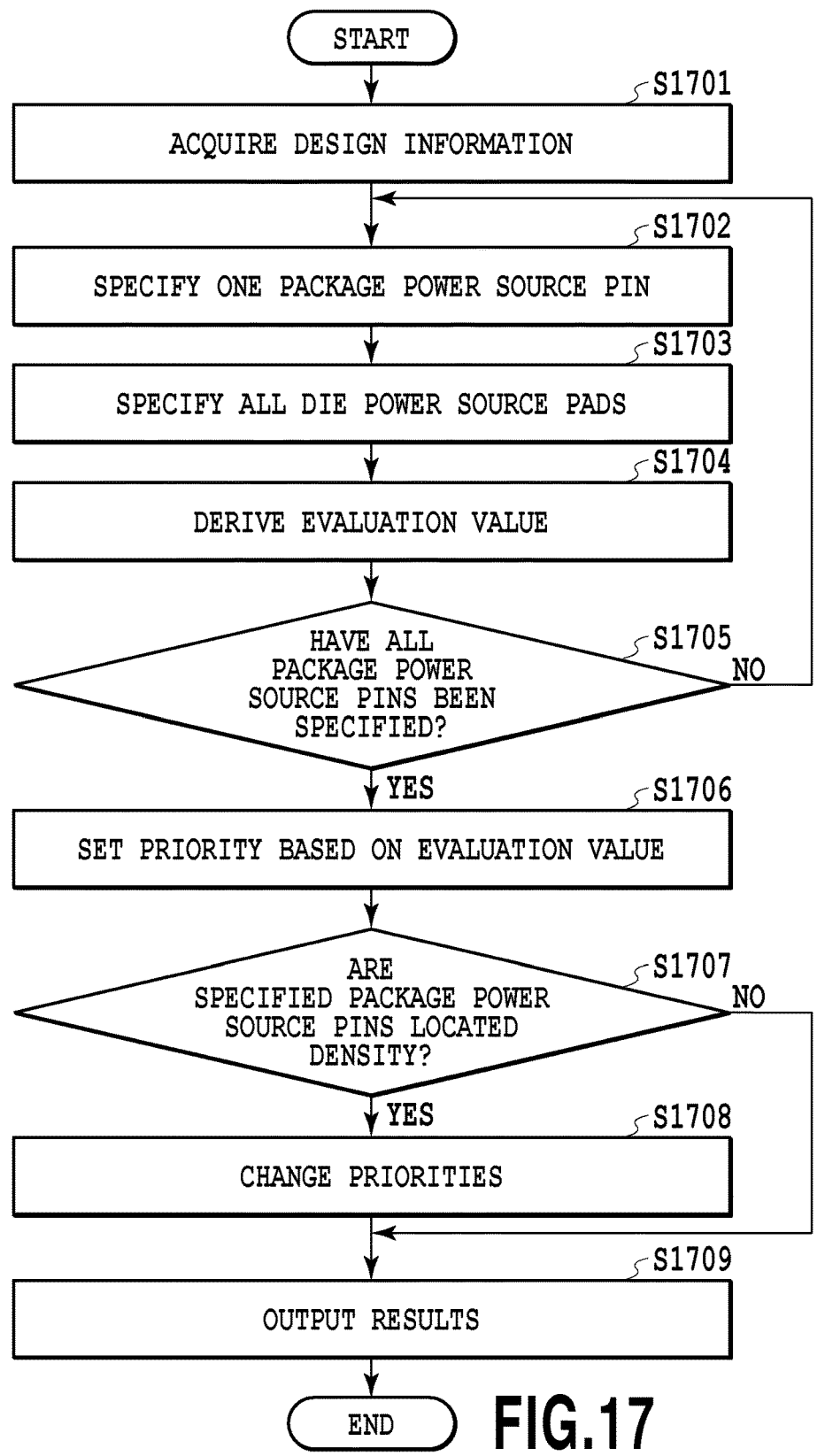
FIG. 17 is a flowchart showing a flow of bypass capacitor arrangement verification processing according to the third embodiment.

FIG. 17 is a flowchart showing a flow of bypass capacitor arrangement verification processing according to the present embodiment. The series of processing is implemented by the CPU 101 loading programs stored in the ROM 102 onto the RAM 103 and executing the programs.

Steps 1701 to 1706 correspond to steps 1001 to 1006 in the flowchart in FIG. 10 of the second embodiment, and therefore, in the following, step 1707 and subsequent steps are explained in detail.

Figure 18:
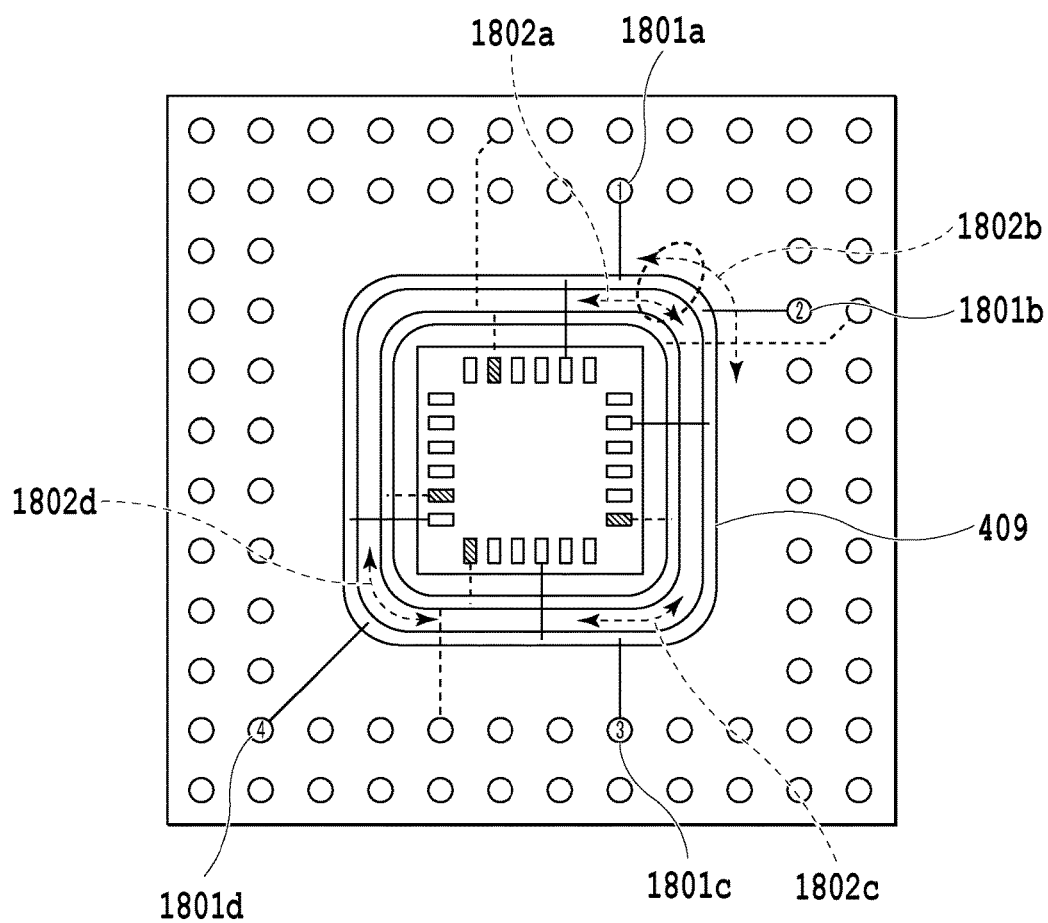

After the priorities are set at step 1706, the priority setting unit 1401 determines whether the specified package VTs at the same potential are located with a predetermined distance being kept in between based on the package information within the design information at step 1707. FIG. 18 is a diagram explaining an example of the method of determining whether a plurality of package VTs at the same potential is located with a predetermined distance being kept in between. In the example in FIG. 18, four package VTs 1801a to 1801d are specified as package power source pins at the same potential and the priorities are in the order of 1810a, 1801b, 1801c, and 1801 from the highest priority. In this case, first, predetermined ranges 1802a to 1802d, which are indicated by bidirectional arrows with the connection point of the power source wiring within the package and the power source ring 406 as a center, are specified for the package VTs 1801a to 1801d, respectively. Whether there is a portion where one of the predetermined ranges 1802a to 1802d for the respective package VTs overlaps another is determined and in the case where there is a portion where the two predetermined ranges overlap, the portion is specified as a dense portion. In the example in FIG. 18, the predetermined range 1802a of the package VT 1801a having the highest priority overlaps the predetermined range 1802b of the package VT 1801b having the second highest priority (portion surrounded by the broken line circle). Because of this, the portion where the package VT 1801a and the package VT 1801b are arranged is specified as a dense portion. As a simpler determination method, it may also be possible to find a direct distance between the specified package VTs and to determine that the two package VTs are located densely in the case where the direct distance that is found is shorter that a predetermined distance. Further, it may also be possible to determine that the two specified package VTs are located densely in the case where the angle formed by the straight line connecting the center of the package of the IC and one of the two package VTs and the straight line connecting the center and the other package VT is smaller than a predetermined angle. In the case where the results of the determination indicate that the dense portion as described above exists, the processing proceeds to step 1708. On the other hand, in the case where it is determined that the dense portion does not exist (the specified package VTs at the same potential are located with a predetermined distance being kept in between), the processing proceeds to step 1709.

At step 1708, the priority setting unit 1401 changes the priorities so that the package VTs in the portion determined to be a dense portion are located sparsely. For example, in the example in FIG. 18 described above, the package VT 1801a having the highest priority and the package VT 1801b having the second highest priority are determined to be located densely. In this case, the priorities are changed so that the priority of the package VT 1801b, which is lower than that of the package VT 1801a, becomes lower than the priorities of the other package VTs 1801c and 1801d whose predetermined ranges do not overlap. In other words, in the example in FIG. 18, the priorities are changed so that the priorities are in the order of 1810a, 1810c, 1810d, and 1810b from the highest priority.

At step 1709, the verification results output unit 240 outputs the priorities (changed priorities) as the verification results to the output device 130. Specifically, the verification results output unit 240 displays the verification results on the display unit or prints the verification results by using a printer. Alternately, it may also be possible to store a file in which the verification results are described in the HDD 120, or to transmit the file to another PC or the like via a network, not shown.

The above is the contents of the processing to verify the bypass capacitor arrangement according to the present embodiment.

In the present embodiment, with the layout design stage in mind, the changed priorities are output as the verification results, but in the layout design completion stage, it may also be possible to output a layout diagram in which the bypass capacitors are rearranged so as to be located sparsely in accordance with the changed priorities as the verification results. FIGS. 19A and 19B are diagrams explaining the way the bypass capacitors are rearranged. FIG. 19A is a diagram showing the state before rearrangement where the bypass capacitor 401a (package VT 1801a) and the bypass capacitor 401b (package VT 1801b) are too close to each other. FIG. 19B is a diagram showing the state after the rearrangement and it is known that the bypass capacitor 401b has been moved so as to be connected with the package VT 1801c whose priority is changed to the second highest priority.

According to the present embodiment, it is made possible to easily implement arrangement in which bypass capacitors are located sparsely.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

According to the present invention, it is possible to grasp appropriate bypass capacitor arrangement in a printed circuit board with high accuracy.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-112746, filed May 30, 2014 which is hereby incorporated by reference wherein in its entirety.

What is claimed is:

1. An information processing apparatus that evaluates an appropriateness of an arrangement of a bypass capacitor on a printed circuit board, comprising:
   a memory device; and
   circuitry communicable with the memory device and configured to:
   specify positions of a power source pad of a die and a ground pad of the die which are arranged within an integrated circuit package based on a power source wiring and a power source ring which are included in design information on the printed circuit board;
   specify a bypass capacitor arranged on the printed circuit board based on the design information;
   derive an evaluation value for evaluating the arrangement of the specified bypass capacitor on the printed circuit board based on the design information, information on the specified positions of the power source pad of the die and the ground pad of the die which are arranged within the integrated circuit package, and information on the specified bypass capacitor; and
   determine whether the arrangement of the specified bypass capacitor on the printed circuit board is appropriate based on the derived evaluation value,
   wherein the arrangement of the specified bypass capacitor on the printed circuit board is rearranged in a case where it is determined that the arrangement of the specified bypass capacitor on the printed circuit board is not appropriate based on the derived evaluation value.

2. The information processing apparatus according to claim 1, wherein to determine whether the arrangement of the specified bypass capacitor on the printed circuit board is appropriate, the circuitry communicable with the memory device:
   sets a condition for verifying the evaluation value; and
   determines whether the derived evaluation value meets the set condition.

3. The information processing apparatus according to claim 2, wherein the circuitry communicable with the memory device is configured to output results of whether the derived evaluation value meets the set condition.

4. The information processing apparatus according to claim 3, wherein
   an aspect of the outputting includes at least one of displaying of the determination results on a display device, printing of the determination results by using a printer, and transmitting or storing in a storage device of a file in which the determination results are described.

5. The information processing apparatus according to claim 1, wherein
   the evaluation value is a length of a path from the specified position of the power source pad of the die up to the specified position of the ground pad of the die via the specified bypass capacitor.

6. The information processing apparatus according to claim 1, wherein
   the evaluation value is an inductance of a path from the specified position of the power source pad of the die up to the specified position of the ground pad of the die via the specified bypass capacitor.

7. The information processing apparatus according to claim 1, wherein
   the circuitry communicable with the memory device specifies a position of a power source pad of a virtual die and a position of a ground pad of the virtual die based on the design information.

8. An information processing apparatus that evaluates an appropriateness of an arrangement of a bypass capacitor on a printed circuit board, comprising:
   a memory device; and
   circuitry communicable with the memory device and configured to:
   specify a position of a power source pad of a die which is arranged within an integrated circuit package based on a power source wiring and a power source ring which are included in design information on the printed circuit board;
   specify a position of a power source pin of a package of an IC on the printed circuit board based on the power source wiring and the power source ring which are included in the design information;
   derive an evaluation value for evaluating the arrangement of the bypass capacitor, which is arranged on the printed circuit board, based on the design information, information on the specified position of the power source pad of the die which is arranged within the integrated circuit package, and information on the specified position of the power source pin of the package; and
   determine whether the arrangement of the bypass capacitor on the printed circuit board is appropriate based on the derived evaluation value,
   wherein the arrangement of the bypass capacitor on the printed circuit board is rearranged in a case where it is determined that the arrangement of the bypass capacitor on the printed circuit board is not appropriate based on the derived evaluation value.

9. The information processing apparatus according to claim 8, wherein the circuitry communicable with the memory device is configured to set priorities, in a case where the bypass capacitor is connected, to power source pins of the package based on the evaluation value.

10. The information processing apparatus according to claim 9, wherein
    the evaluation value is a path length from the specified position of the power source pad of the die up to the specified position of the power source pin of the package, and
    a higher priority is set to a power source pin of the package whose path length is shorter.

11. The information processing apparatus according to claim 9, wherein
    the evaluation value is an inductance of a path from the specified position of the power source pad of the die up to the specified position of the power source pin of the package, and
    a higher priority is set to a power source pin of the package whose inductance of the path is lower.

12. The information processing apparatus according to claim 9, wherein
the circuitry communicable with the memory device changes priorities, in a case where a plurality of power source pins of the package to which priorities higher than those of other power source pins of the package are set is located densely within a predetermined range, so as to eliminate the dense state.

13. The information processing apparatus according to claim 9, wherein the circuitry communicable with the memory device is configured to output the priorities.

14. The information processing apparatus according to claim 13, wherein
an aspect of the outputting includes at least one of displaying of the priorities on a display device, printing of the priorities by using a printer, and transmitting or storing in a storage device of a file in which the priorities are described.

15. The information processing apparatus according to claim 9, wherein the circuitry communicable with the memory device is configured to arrange the bypass capacitors in accordance with the priorities in a case where positions of the power source pins of the package to which the bypass capacitors are connected have already been specified.

16. A method of evaluating an appropriateness of an arrangement of a bypass capacitor on a printed circuit board, the method comprising:
specifying positions of a power source pad of a die and a ground pad of the die which are arranged within an integrated circuit package based on a power source wiring and a power source ring which are included in design information on the printed circuit board;
specifying a bypass capacitor arranged on the printed circuit board based on the design information;
deriving an evaluation value for evaluating the arrangement of the specified bypass capacitor on the printed circuit board based on the design information, information on the specified positions of the power source pad of the die and the ground pad of the die which are arranged within the integrated circuit package, and information on the specified bypass capacitor; and
determining whether the arrangement of the specified bypass capacitor on the printed circuit board is appropriate based on the derived evaluation value,
wherein the arrangement of the specified bypass capacitor on the printed circuit board is rearranged in a case where it is determined that the arrangement of the specified bypass capacitor on the printed circuit board is not appropriate based on the derived evaluation value.

17. A method of evaluating an appropriateness of an arrangement of a bypass capacitor on a printed circuit board, the method comprising:
specifying a position of a power source pad of a die which is arranged within an integrated circuit package based on a power source wiring and a power source ring which are included in design information on the printed circuit board;
specifying a position of a power source pin of a package of an IC on the printed circuit board based on the power source wiring and the power source ring which are included in the design information;
deriving an evaluation value for evaluating the arrangement of the bypass capacitor on the printed circuit board based on the design information, information on the specified position of the power source pad of the die which is arranged within the integrated circuit package, and information on the specified position of the power source pin of the package; and
determine whether the arrangement of the bypass capacitor on the printed circuit board is appropriate based on the derived evaluation value,
wherein the arrangement of the bypass capacitor on the printed circuit board is rearranged in a case where it is determined that the arrangement of the bypass capacitor on the printed circuit board is not appropriate based on the derived evaluation value.

18. A non-transitory computer readable storage medium storing a program for causing a computer to perform the following:
specifying positions of a power source pad of a die and a ground pad of the die which are arranged within an integrated circuit package based on a power source wiring and a power source ring which are included in design information on a printed circuit board;
specifying a bypass capacitor arranged on the printed circuit board based on the design information;
deriving an evaluation value for evaluating an arrangement of the specified bypass capacitor on the printed circuit board based on the design information, information on the specified positions of the power source pad of the die and the ground pad of the die which are arranged within the integrated circuit package, and information on the specified bypass capacitor; and
determining whether the arrangement of the specified bypass capacitor on the printed circuit board is appropriate based on the derived evaluation value,
wherein the arrangement of the specified bypass capacitor on the printed circuit board is rearranged in a case where it is determined that the arrangement of the specified bypass capacitor on the printed circuit board is not appropriate based on the derived evaluation value.

* * * * *